United States Patent
Lee et al.

(10) Patent No.: US 11,856,819 B2
(45) Date of Patent: Dec. 26, 2023

(54) DISPLAY MODULE HAVING A CIRCUIT INSULATING LAYER

(71) Applicant: Samsung Display Co., Ltd., Yongin-Si (KR)

(72) Inventors: Seung-Hoon Lee, Hwaseong-si (KR); Sangmin Kim, Suwon-si (KR); Byoung-Hun Sung, Hwaseong-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 17/554,470

(22) Filed: Dec. 17, 2021

(65) Prior Publication Data

US 2022/0109035 A1    Apr. 7, 2022

Related U.S. Application Data

(63) Continuation of application No. 16/898,343, filed on Jun. 10, 2020, now Pat. No. 11,205,688.

(30) Foreign Application Priority Data

Sep. 4, 2019   (KR) .................. 10-2019-0109655

(51) Int. Cl.
*G06F 3/044* (2006.01)
*H10K 59/40* (2023.01)
*H10K 59/122* (2023.01)
*H10K 50/86* (2023.01)

(52) U.S. Cl.
CPC ......... *H10K 59/122* (2023.02); *G06F 3/0446* (2019.05); *H10K 50/86* (2023.02); *H10K 59/40* (2023.02)

(58) Field of Classification Search
CPC ...... G06F 3/0446; G06F 3/044; H10K 59/122
See application file for complete search history.

(56) References Cited

U.S. PATENT DOCUMENTS

| | | | |
|---|---|---|---|
| 9,520,452 B2 | 12/2016 | Lim et al. | |
| 10,164,204 B2 | 12/2018 | Chen | |
| 10,167,417 B2 | 1/2019 | Pieper et al. | |
| 10,541,380 B1 | 1/2020 | Sung et al. | |
| 11,205,688 B2 * | 12/2021 | Lee | H10K 59/40 |

(Continued)

FOREIGN PATENT DOCUMENTS

| | | |
|---|---|---|
| KR | 10-2014-0108029 A | 9/2014 |
| KR | 10-2017-0051764 A | 5/2017 |
| KR | 10-2019-0011267 A | 2/2019 |

*Primary Examiner* — Kevin M Nguyen
(74) *Attorney, Agent, or Firm* — Innovation Counsel LLP

(57) ABSTRACT

A display module may include a display panel that includes a base layer, a circuit insulating layer, a first electrode, and an emission layer. The circuit insulating layer may include a first portion having a first thickness, a second portion having a second thickness greater than the first thickness, and a third portion having a third thickness greater than the second thickness. The first electrode may include a first electrode portion disposed on the first portion and a second electrode portion extending from the first electrode portion and disposed on the second portion. The emission layer may include a first light-emitting portion disposed on the first electrode portion and a second light-emitting portion extending from the first light-emitting portion and disposed on the second electrode portion.

11 Claims, 15 Drawing Sheets

(56) References Cited

U.S. PATENT DOCUMENTS

| | | |
|---|---|---|
| 2015/0169094 A1 | 6/2015 | Liu et al. |
| 2017/0005286 A1 | 1/2017 | Yun et al. |
| 2017/0125740 A1 | 5/2017 | Lee et al. |
| 2017/0288154 A1 | 10/2017 | Seo et al. |
| 2019/0206945 A1* | 7/2019 | Lin .................. H01L 27/14621 |
| 2019/0221780 A1 | 7/2019 | Ishikawa et al. |
| 2020/0077518 A1 | 3/2020 | Kim et al. |
| 2020/0279979 A1 | 9/2020 | Lee et al. |
| 2020/0403131 A1 | 12/2020 | Kim et al. |
| 2021/0020704 A1 | 1/2021 | Kim |
| 2021/0066415 A1 | 3/2021 | Lee et al. |
| 2021/0098733 A1 | 4/2021 | Baik et al. |

\* cited by examiner

DISPLAY MODULE HAVING A CIRCUIT INSULATING LAYER

CROSS-REFERENCE TO RELATED APPLICATIONS

This application is a continuation of U.S. patent application Ser. No. 16/898,343, filed on Jun. 10, 2020, which claims priority to and the benefit of Korean Patent Application No. 10-2019-0109655, filed on Sep. 4, 2019, in the Korean Intellectual Property Office, the disclosure of which is hereby incorporated by reference in its entirety.

BACKGROUND OF THE INVENTION

The present disclosure relates to a display module, and in particular, to a display module with improved optical efficiency.

Various display devices are being developed for use in multimedia devices, such as smart phones, tablet computers, televisions, navigation systems, and gaming machines. To improve users' recognition of an image displayed on a display panel, some display devices may include anti-reflection layer to reduce reflection of an external light from the display panel.

The display device may use a color filter to absorb the external light incident to the display panel. However, a portion of the external light absorbed by the color filter may be reflected toward the display panel, and the reflected external light may be viewed to the user as a color stripe in the display panel.

SUMMARY

An embodiment of the inventive concept provides a display module with improved optical efficiency.

According to an embodiment of the inventive concept, a display module may include a display panel. The display panel may include a base layer, a circuit insulating layer disposed on the base layer and including a first portion having a first thickness, a second portion having a second thickness that is greater than the first thickness, and a third portion having a third thickness that is greater than the second thickness, a first electrode including a first electrode portion that is disposed on the first portion of the circuit insulating layer, and a second electrode portion that extends from the first electrode portion and is disposed on the second portion of the circuit insulating layer, and an emission layer including a first light-emitting portion that is disposed on the first electrode portion of the first electrode, and a second light-emitting portion that extends from the first light-emitting portion and is disposed on the second electrode portion of the first electrode.

In an embodiment, the first thickness may be uniform, the second thickness may increase in a direction from the first portion toward the third portion, and the third thickness may be uniform.

In an embodiment, the display panel may further include an anti-reflection layer disposed on the emission layer. The anti-reflection layer may include a partition wall having a top surface, a bottom surface opposite to the top surface, and a first inner side surface defining an opening that overlaps the first portion. The opening may have a width that is equal to or larger than a length of the first portion of the circuit insulating layer in a cross-sectional view.

In an embodiment, the second portion may include an inclined surface. The inclined surface may have a first inclination angle with respect to the base layer in the cross-sectional view. The first inner side surface may have a second inclination angle with respect to the base layer in the cross-sectional view. A sum of the first inclination angle and the second inclination angle may be substantially 90°.

In an embodiment, the display module may further include an input sensing circuit disposed on the display panel. The input sensing circuit may include a connection pattern disposed on the display panel, a first insulating layer, in which a contact hole exposing at least a portion of the connection pattern is defined, a plurality of sensors that are disposed on the first insulating layer, and at least one of the plurality of sensors is electrically connected to the connection pattern, a second insulating layer having a first refractive index and covering the plurality of sensors, and a third insulating layer disposed on the first insulating layer and the second insulating layer and having a second refractive index greater than the first refractive index.

In an embodiment, the display panel may further include an anti-reflection layer disposed on the emission layer. The anti-reflection layer may include a partition wall having a top surface, a bottom surface opposite to the top surface, and a first inner side surface defining an opening that overlaps the first portion. The second insulating layer may include a second inner side surface defining a touch opening that overlaps the opening. An angle between the second inner side surface and the base layer in a cross-sectional view may be acute and may be greater than a second inclination angle that is an angle between the first inner side surface and the base layer and is acute in the cross-sectional view.

In an embodiment, the first thickness may be uniform, the second thickness may increase in a direction away from the first portion, and the third thickness may increase in a direction away from the second portion. The first electrode may further include a third electrode portion that extends from the second electrode portion and is disposed on the third portion. The emission layer may further include a third light-emitting portion that extends from the second light-emitting portion and is disposed on the third electrode portion.

In an embodiment, the display panel may further include an anti-reflection layer disposed on the emission layer. The anti-reflection layer may include a partition wall having a top surface, a bottom surface opposite to the top surface, and a first inner side surface defining an opening that overlaps the first portion. The opening may have a width that is equal to or larger than a length of the first portion of the circuit insulating layer in a cross-sectional view.

In an embodiment, the second portion may include a first inclined surface having a first inclination angle with respect to the base layer in a cross-sectional view, a second inclination angle may be defined between the first inner side surface and the base layer in the cross-sectional view, and the third portion may include a second inclined surface having a third inclination angle with respect to the base layer in the cross-sectional view. A sum of the first inclination angle and the third inclination angle may be substantially 90°.

In an embodiment, the third inclination angle may be greater than the first inclination angle.

In an embodiment, the display module may further include an input sensing circuit disposed on the display panel. The input sensing circuit may include a connection pattern disposed on the display panel, a first insulating layer, in which a contact hole exposing at least a portion of the connection pattern is defined, a plurality of sensors disposed on the first insulating layer, and at least one of the plurality of sensors is electrically connected to the connection pattern, a second insulating layer having a first refractive index and covering the plurality of sensors, and a third insulating layer disposed on the first insulating layer and the second insulating layer and having a second refractive index greater than the first refractive index.

In an embodiment, the display panel may further include an anti-reflection layer disposed on the emission layer. The anti-reflection layer may include a partition wall having a top surface, a bottom surface opposite to the top surface, and a first inner side surface defining an opening that overlaps the first portion. The second insulating layer may include a second inner side surface defining a touch opening that overlaps the opening. An angle between the second inner side surface and the base layer in a cross-sectional view may be greater than a second inclination angle between the first inner side surface and the base layer in the cross-sectional view.

In an embodiment, the first portion, the second portion, and the third portion may be provided as a single layer.

According to an embodiment of the inventive concept, a display module may include a display panel and an input sensing circuit disposed on the display panel. The display panel may include a base layer, a circuit insulating layer including a first sub-layer that is disposed on the base layer, and a second sub-layer that is disposed on the first sub-layer and includes a first inclined surface, wherein the first inclined surface has a first inclination angle with respect to the base layer in a cross-sectional view, a first electrode including a first electrode portion that is disposed on the first sub-layer and a second electrode portion that is disposed on the second sub-layer, and an emission layer including a first light-emitting portion that is disposed on the first electrode portion and a second light-emitting portion that is disposed on the second electrode portion.

In an embodiment, the display panel may further include an anti-reflection layer disposed on the emission layer. The anti-reflection layer may include a partition wall having a top surface, a bottom surface opposite to the top surface, and a first inner side surface defining an opening that overlaps the first sub-layer. The opening may have a width that is equal to or larger than a length of the first sub-layer that is exposed by the second sub-layer.

In an embodiment, a second inclination angle may be defined between the first inner side surface and the base layer in the cross-sectional view. A sum of the first inclination angle and the second inclination angle may be substantially 90°.

In an embodiment, the display panel may further include a second electrode disposed on the emission layer and an encapsulation layer disposed on the second electrode. The input sensing circuit may include a connection pattern disposed on the encapsulation layer, a first insulating layer, in which a contact hole exposing at least a portion of the connection pattern is defined, a plurality of sensors disposed on the first insulating layer, and at least one of the plurality of sensors is electrically connected to the connection pattern, a second insulating layer having a first refractive index and covering the plurality of sensors, and a third insulating layer disposed on the first insulating layer and the second insulating layer and having a second refractive index that is greater than the first refractive index.

In an embodiment, the circuit insulating layer may further include a third sub-layer that extends from the second sub-layer and includes a second inclined surface. The first electrode may further include a third electrode portion that is disposed on the third sub-layer, and the emission layer may further include a third light-emitting portion that is disposed on the third electrode portion.

In an embodiment, the display panel may further include an anti-reflection layer disposed on the emission layer. The anti-reflection layer may include a partition wall having a top surface, a bottom surface opposite to the top surface, and a first inner side surface defining an opening that overlaps the first sub-layer. The opening may have a width that is equal to or larger than a length of the first sub-layer that is exposed by the second sub-layer.

In an embodiment, an angle between the first inner side surface and the base layer in the cross-sectional view may be defined as a second inclination angle. An angle between the second inclined surface and the base layer in the cross-sectional view may be defined as a third inclination angle. A sum of the second inclination angle and the third inclination angle may be substantially 90°.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
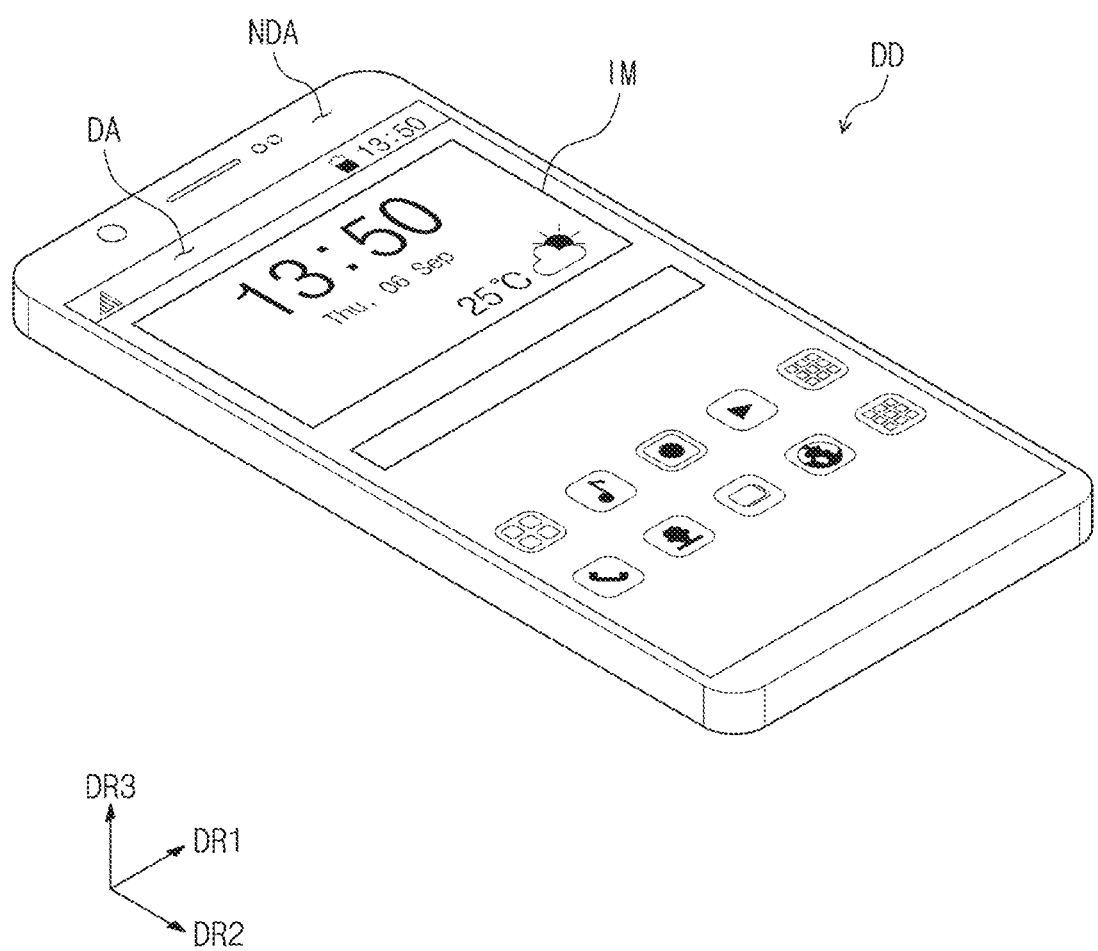
FIG. 1 is a perspective view of a display device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present inventive concepts will now be described more fully with reference to the accompanying drawings, in which example embodiments are shown. Example embodiments of the present inventive concepts may, however, be embodied in many different forms and should not be construed as being limited to the example embodiments set forth herein; rather, the example embodiments are provided so that the present disclosure will be thorough and complete, and will fully convey the inventive concepts of the example embodiments to those of ordinary skill in the art. In the drawings, the thicknesses of layers and regions are exaggerated for clarity. Like reference numerals in the drawings denote like elements, and thus their description will be shortened or omitted.

It will be understood that when an element is referred to as being "connected" or "coupled" to another element, it can be directly connected or coupled to the another element, or one or more intervening elements may be present. In contrast, when an element is referred to as being "directly connected" or "directly coupled" to another element, there are no intervening elements present. Like numbers indicate like elements throughout the present disclosure. As used herein the term "and/or" includes any and all combinations of one or more of the associated listed items. Other words used to describe a relationship between elements or layers should be interpreted in a like fashion (e.g., "between" versus "directly between," "adjacent" versus "directly adjacent," and "on" versus "directly on").

It will be understood that, although the terms "first," "second," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of a device in use or operation in addition to the orientation depicted in the figures. For example, if the device in the figures is turned over, elements described as "below" or "beneath" other elements or features would then be oriented "above" or "over" the other elements or features. Thus, the exemplary term "below" can encompass both an orientation of above and below. The device may be otherwise oriented (rotated 90 degrees or at other orientations), and the spatially relative descriptors used herein may be interpreted accordingly.

The terminology used herein is for the purpose of describing particular embodiments and is not intended to be limiting of the example embodiments. As used herein, the singular forms "a," "an," and "the" are intended to include plural forms as well, unless the context clearly indicates otherwise. It will be further understood that the terms "comprises," "comprising," "includes," and/or "including," used herein, specify the presence of stated features, integers, steps, operations, elements, and/or components, but do not preclude the presence or addition of one or more other features, integers, steps, operations, elements, components, and/or groups thereof.

Example embodiments described herein with reference to cross-sectional illustrations are schematic illustrations of idealized embodiments (and intermediate structures). As such, variations from the shapes of the illustrations as a result, for example, of manufacturing techniques, deviations, and/or tolerances, are to be expected. Thus, the example embodiments of the present inventive concepts should not be construed as limited to the particular shapes of regions illustrated herein but are to include deviations in shapes that may result, for example, from manufacturing.

Unless otherwise defined, terms (including technical and scientific terms) used herein have the same meaning as commonly understood by one of ordinary skill in the art to which example embodiments of the present inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a display device DD according to an embodiment of the inventive concept. FIG. 1 illustrates a smart phone as an example in which the display device DD. However, the inventive concept of the present disclosure is not limited to this example, and in an embodiment, the display device DD may be a large-sized electronic device (e.g., a television set and a monitor) or a small- or medium-sized electronic device (e.g., a portable phone, a tablet, a car navigation system, a game machine, and a smart watch).

An image region DA and a bezel region NDA may be defined in the display device DD.

The image region DA, in which an image IM is displayed, may be parallel to both of a first direction DR1 and a second direction DR2. A direction normal to the image region DA (i.e., a thickness direction of the display device DD) will be referred to as a third direction DR3. A front or top surface and a rear or bottom surface of each layer, member, component of the display device DD may be distinguished based on the third direction DR3. However, directions indicated by the first to third directions DR1, DR2, and DR3 may be relative concept, and in an embodiment, they may be changed to indicate other directions. Hereinafter, directions respectively indicated by the first to third directions DR1, DR2, and DR3 and will be referenced with the same reference numbers.

The shape of the image region DA shown in FIG. 1 may be just an example, and the shape of the image region DA may be freely changed without deviating from the scope of the present disclosure.

The bezel region NDA may be adjacent to the image region DA and may not be used to display the image IM. A bezel region of the display device DD may be defined by the bezel region NDA.

The bezel region NDA may enclose the image region DA. However, the inventive concept of the present disclosure is not limited to this example, and in an embodiment, the shapes of the image region DA and the bezel region NDA may be variously changed in a complementary manner.

Figure 2A:
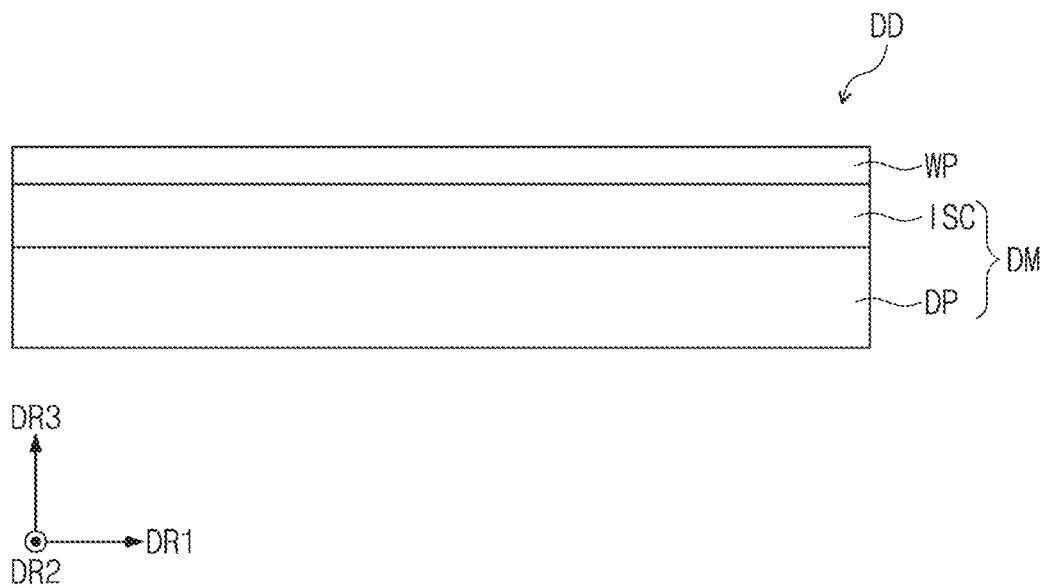
FIG. 2A is a sectional view illustrating some elements forming a display device according to an embodiment of the inventive concept.
Figure 2B:
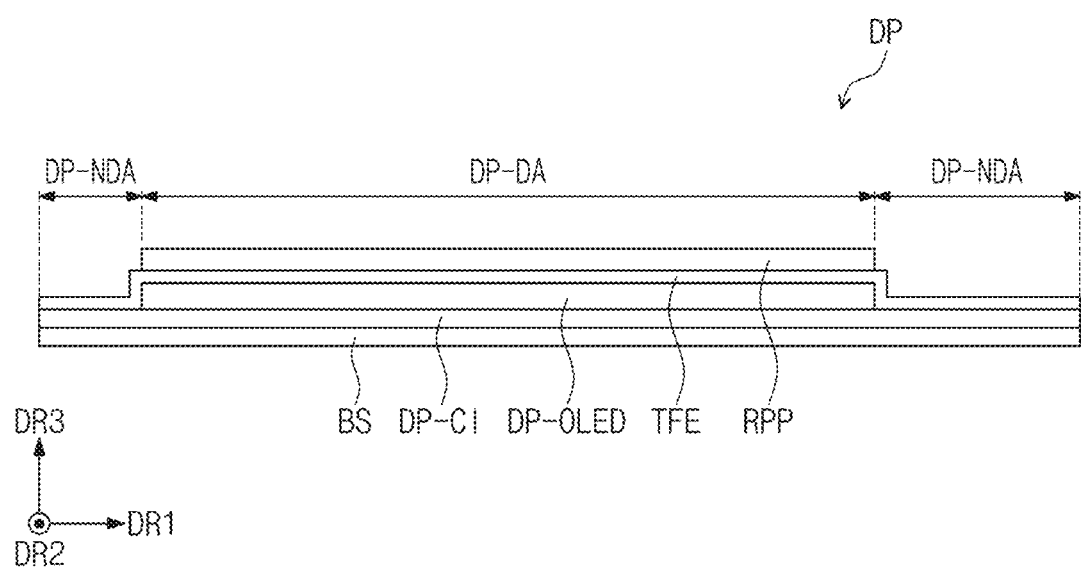
FIG. 2B is a sectional view of a display panel according to an embodiment of the inventive concept.

FIG. 2A is a sectional view illustrating some elements forming the display device DD according to an embodiment of the inventive concept. FIG. 2B is a sectional view of a display panel DP according to an embodiment of the inventive concept.

FIG. 2A illustrates a vertical section taken parallel to a plane defined by the second and third directions DR2 and DR3. In order to describe a stacking structure of functional panels, members, and/or units forming the display device DD, FIG. 2A is illustrated in a simplified manner. In an embodiment, the display device DD may include a window unit WP and a display module DM. In an embodiment, the display module DM may include a display panel DP and an input sensing circuit ISC.

In an embodiment, the window unit WP may include glass and/or synthetic resin. The window unit WP may not be limited to a single-layered structure. For example, the window unit WP may include two or more films that are bonded to each other by an adhesive member.

In an embodiment, the input sensing circuit ISC may be directly disposed on the display panel DP. In the present specification, the expression "an element is directly disposed on another element" may indicate that an additional adhesive layer or member is not disposed between the two elements. However, the inventive concept is not limited to this example.

The input sensing circuit ISC may obtain information on coordinates of an external input (e.g., a touch event or an applied pressure). For example, the input sensing circuit ISC may be a touch sensing circuit for sensing a touch event from a user, or may be a fingerprint sensing circuit for reading a fingerprint of a user's finger. However, the inventive concept is not limited to these examples.

Referring to FIG. 2B, the display panel DP may include a base layer BS, and a circuit device layer DP-CI, a display device layer DP-OLED, a thin encapsulation layer TFE, and an anti-reflection layer RPP that are disposed on the base layer BS. The display panel DP may generate an image. The display panel DP may include a display region DP-DA that is used to generate an image, and a non-display region DP-NDA that is not used to generate an image. The display region DP-DA may correspond to the image region DA of FIG. 1, and the non-display region DP-NDA may correspond to the bezel region NDA of FIG. 1. In the present specification, the expression "one region corresponds to another region" may indicate that the two regions are overlapped but are not limited to have the same area and/or the same shape.

The base layer BS may include at least one plastic film. Examples of the base layer BS may include, but are not limited to, a plastic substrate, a glass substrate, a metal substrate, and a substrate made of an organic/inorganic composite material.

The circuit device layer DP-CI may include at least one insulating layer and a circuit device (not shown). In an embodiment, the circuit device layer DP-CI may include a circuit insulating layer CI and an intermediate insulating layer CI-U.

The circuit device may include signal lines, pixel-driving circuits, and so forth. The formation of the circuit device layer DP-CI may include forming an insulating layer, a semiconductor layer, and a conductive layer using a coating or deposition process, and patterning the insulating layer, the semiconductor layer, and the conductive layer using a photolithography and etching process.

The display device layer DP-OLED may include a light emitting device LD. The display device layer DP-OLED may include organic light emitting diodes. The display device layer DP-OLED may further include an organic layer, such as a pixel definition layer PDL.

The thin encapsulation layer TFE may seal the display device layer DP-OLED. The thin encapsulation layer TFE may include at least one insulating layer. In an embodiment, the thin encapsulation layer TFE may include at least one inorganic layer (hereinafter, an inorganic encapsulation layer). In another embodiment, the thin encapsulation layer TFE may include at least one organic layer (hereinafter, an organic encapsulation layer) and at least one inorganic encapsulation layer.

The inorganic encapsulation layer may protect the display device layer DP-OLED from moisture or oxygen, and the organic encapsulation layer may protect the display device layer DP-OLED from a contamination material such as dust particles. The inorganic encapsulation layer may include a silicon nitride layer, a silicon oxynitride layer, a silicon oxide layer, a titanium oxide layer, or an aluminum oxide layer, but the inventive concept of the present disclosure is not limited to these examples. The organic encapsulation layer may include an acrylic organic layer, but the inventive concept of the present disclosure is not limited to this example.

The anti-reflection layer RPP may reduce reflectance of an external light that is incident to the window unit WP from the outside. In an embodiment, the anti-reflection layer RPP may include a partition wall BM and an organic layer OL. However, the inventive concept of the present disclosure is not limited to this example. Although not shown, the anti-reflection layer RPP may further include a destructive interference structure. For example, the destructive interference structure may include a first reflection layer and a second reflection layer that are provided on different layers or at different levels. First and second reflection lights that are respectively reflected by the first and second reflection layers may destructively interfere with each other, and thus, the reflectance of the external light may be reduced.

Although not shown, the display module DM may further include a protection member disposed on a bottom surface of the display panel DP. The protection member and the display panel DP may be coupled to each other by an adhesive member.

In an embodiment, the display panel DP may be a light-emitting type display panel. For example, the display panel DP may be an organic light emitting display panel or a quantum dot light emitting display panel. An emission layer of the organic light emitting display panel may include an organic light emitting material. An emission layer of the quantum dot light emitting display panel may include a quantum dot, a quantum rod, or the like.

Figure 3:
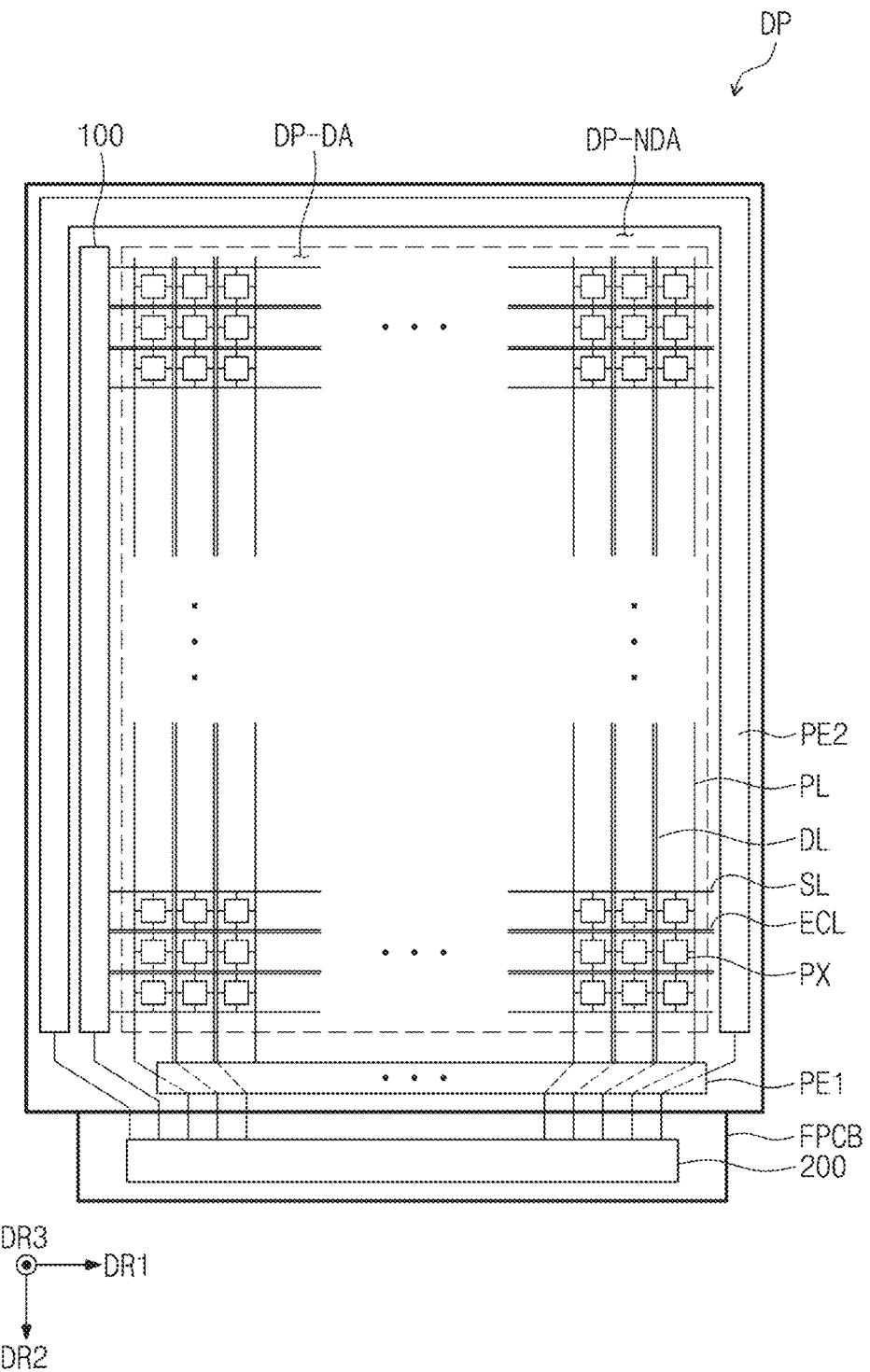
FIG. 3 is a plan view of a display panel according to an embodiment of the inventive concept.

FIG. 3 is a plan view of the display panel DP according to an embodiment of the inventive concept.

The display panel DP may include the display region DP-DA and the non-display region DP-NDA, when viewed in a plan view. In the present embodiment, the non-display region DP-NDA may be defined along an edge or an outer boundary of the display region DP-DA. The display region DP-DA and the non-display region DP-NDA of the display panel DP may respectively correspond to the image region DA and the bezel region NDA of the display device DD shown in FIG. 1.

The display panel DP may include a scan driver 100, a data driver 200, a plurality of scan lines SL, a plurality of emission control lines ECL, a plurality of data lines DL, a plurality of power lines PL, a first power electrode PE1, a second power electrode PE2, and a plurality of pixels PX. The pixels PX may be disposed in the display region DP-DA. Each of the pixels PX may include an emission layer and a pixel circuit connected thereto.

The scan driver 100 may include a scan driving part and an emission control driving part.

The scan driving part of the scan driver 100 may generate scan signals and sequentially output the generated scan signals to the scan lines SL. The emission control driving part of the scan driver 100 may generate emission control signals and output the generated emission control signals to the emission control lines ECL.

In certain embodiments, the scan driving part and the emission control driving part may be provided as a single circuit, not as separate elements, in the scan driver 100.

The scan driver 100 may include a plurality of thin film transistors that may be formed by the same process as that for forming the driving circuit of the pixels PX (e.g., by a low temperature polycrystalline silicon (LTPS) process or a low temperature polycrystalline oxide (LTPO) process).

The data driver 200 may output data signals to the data lines DL. The data signals may be analog voltages having voltage levels that are determined based on gradation levels of the image data.

In an embodiment, the data driver 200 may be mounted on a printed circuit board FPCB, and the printed circuit board FPCB may be connected to pads that may be disposed at terminal ends of the data lines DL. However, the inventive concept is not limited to this example, and in an embodiment, the data driver 200 may be directly mounted on the display panel DP.

The scan lines SL may extend in the first direction DR1 and may be arranged in the second direction DR2.

The emission control lines ECL may extend in the first direction DR1 and may be arranged in the second direction DR2. Each of the emission control lines ECL may be arranged to be parallel to a corresponding one of the scan lines SL.

The data lines DL may extend in the second direction DR2 and may be arranged in the first direction DR1. The data lines DL may be used to deliver the data signals to corresponding ones of the pixels PX.

The power lines PL may extend in the second direction DR2 and may be arranged in the first direction DR1. The power lines PL may provide a first power ELVDD to corresponding ones of the pixels PX.

The first power electrode PE1 may provide the first power ELVDD to the pixels PX via the power lines PL, and the second power electrode PE2 may provide a second power (not shown) to the pixels PX.

Each of the pixels PX may be coupled to a corresponding one of the scan lines SL, a corresponding one of the emission control lines ECL, a corresponding one of the data lines DL, and a corresponding one of the power lines PL.

Figure 4:
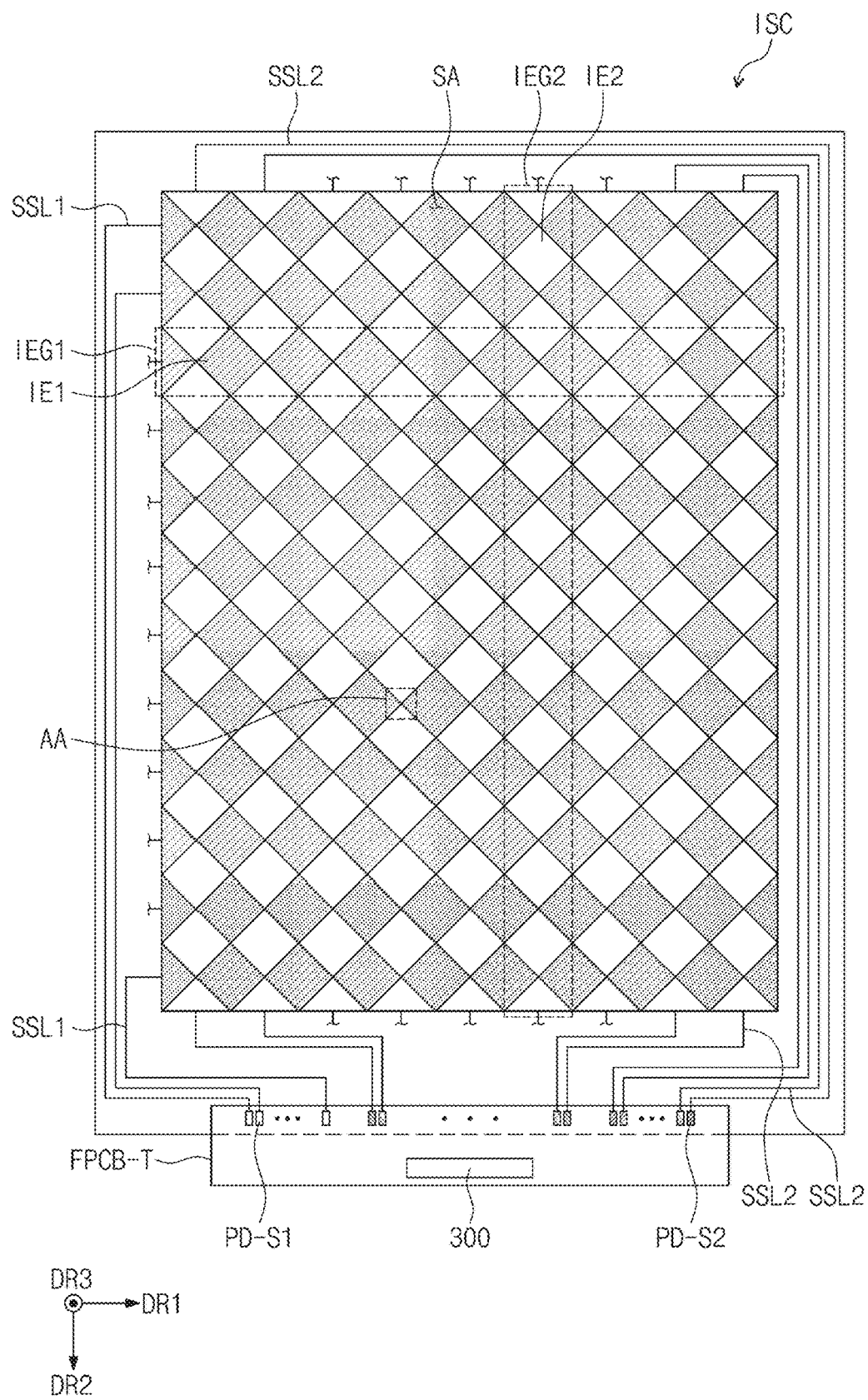
FIG. 4 is a plan view of an input sensing circuit according to an embodiment of the inventive concept.

FIG. 4 is a plan view of the input sensing circuit ISC according to an embodiment of the inventive concept.

An input sensing region SA that is used to sense an external input may be defined in the input sensing circuit ISC.

The input sensing circuit ISC may include first sensor groups IEG1, second sensor groups IEG2, first signal lines SSL1, second signal lines SSL2, first signal pads PD-S1, second signal pads PD-S2, a printed circuit board FPCB-T, and an input sensing driver 300.

The first sensor groups IEG1 may extend in the first direction DR1 and may be arranged in the second direction DR2. Each of the first sensor groups IEG1 may include a plurality of first sensor patterns IE1 (hereinafter, first sensors). For example, the first sensor IE1 may be a receiving (Rx) sensor.

The second sensor groups IEG2 may extend in the second direction DR2 and may be arranged in the first direction DR1. Each of the second sensor groups IEG2 may include a plurality of second sensor patterns IE2 (hereinafter, second sensors). For example, the second sensor IE2 may be a transmitting (Tx) sensor.

In an embodiment, a length of each of the first sensor groups IEG1 measured in the first direction DR1 may be shorter than a length of each of the second sensor groups IEG2 measured in the second direction DR2. However, the inventive concept is not limited to this example.

In an embodiment, each of the first sensors IE1 may be capacitively coupled with ones of the second sensors IE2 adjacent thereto to form a capacitor. In an embodiment, each of the first and second sensors IE1 and IE2 may be capacitively coupled with an external object (e.g., a user's finger) to form a capacitor.

In an embodiment, the input sensing circuit ISC may sense a change in capacitance between the first sensors IE1 and the second sensors IE2 caused by an external input event. In an embodiment, the input sensing circuit ISC may sense a change in capacitance between the first and second sensors IE1 and IE2 caused by an external object and may determine a coordinate of an external input event.

The first signal lines SSL1 may be electrically connected to respective ones of the first sensor groups IEG1. In an embodiment, the first signal lines SSL1 may be connected to the first sensor groups IEG1 in a single routing structure. However, the inventive concept is not limited to this example.

The second signal lines SSL2 may be electrically connected to respective ones of the second sensor groups IEG2. In an embodiment, the second signal lines SSL2 may be connected to the second sensor groups IEG2 in a double routing structure. However, the inventive concept is not limited to this example. In certain embodiments, the second signal lines SSL2 may be connected to the second sensor groups IEG2 in a single routing structure.

The first signal pads PD-S1 may be connected to the first signal lines SSL1. The second signal pads PD-S2 may be connected to the second signal lines SSL2.

The printed circuit board FPCB-T may be electrically connected to the first and second signal pads PD-S1 and PD-S2.

The input sensing driver 300 may be mounted on the printed circuit board FPCB-T. The input sensing driver 300 may transmit, receive, and/or process an electrical signal that is used to determine occurrence of a touch event from a user in the input sensing region SA and/or an amount of pressure exerted on the input sensing region SA.

Figure 5:
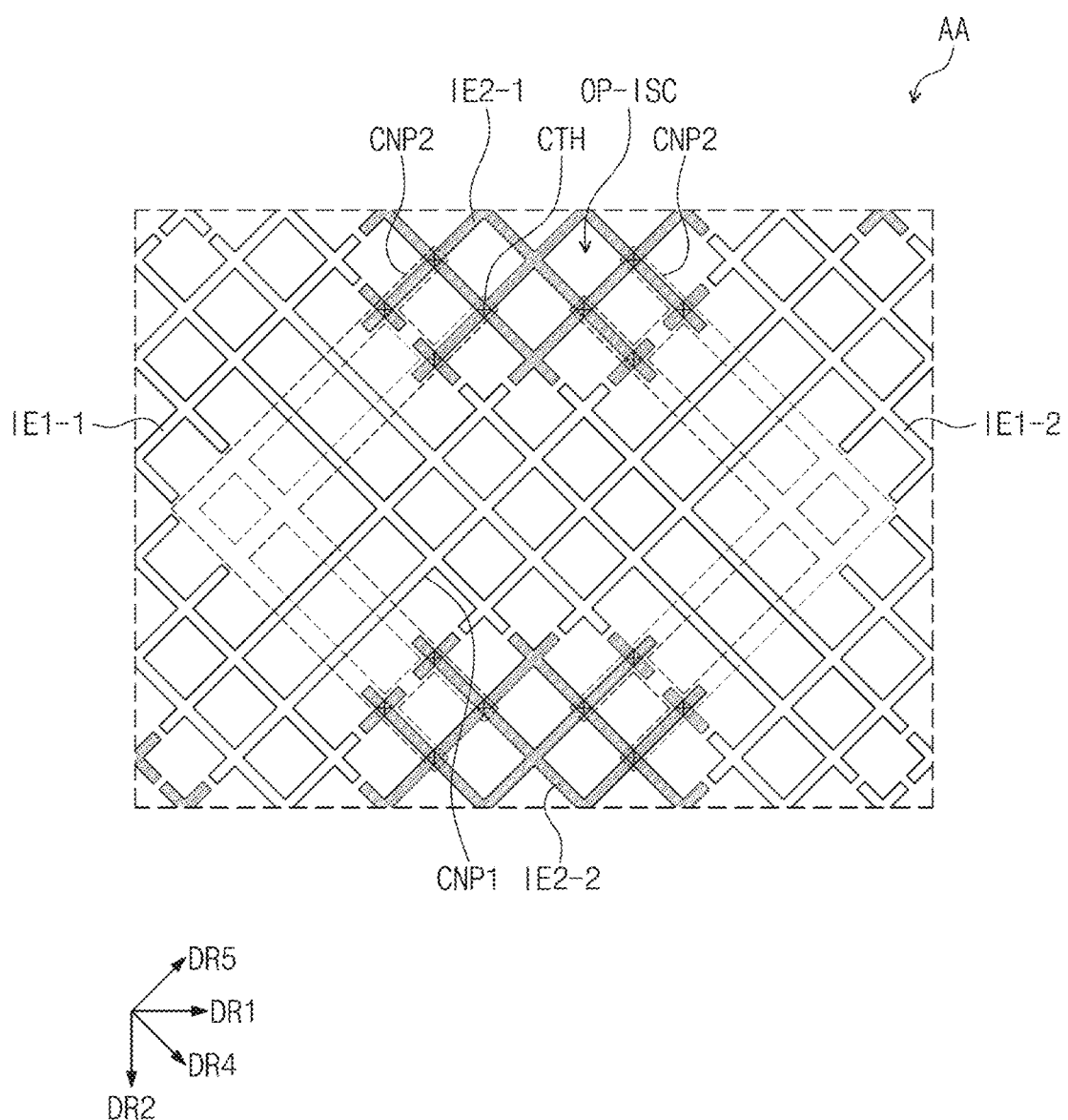
FIG. 5 is an enlarged plan view of a region AA of FIG. 4.
Figure 6:
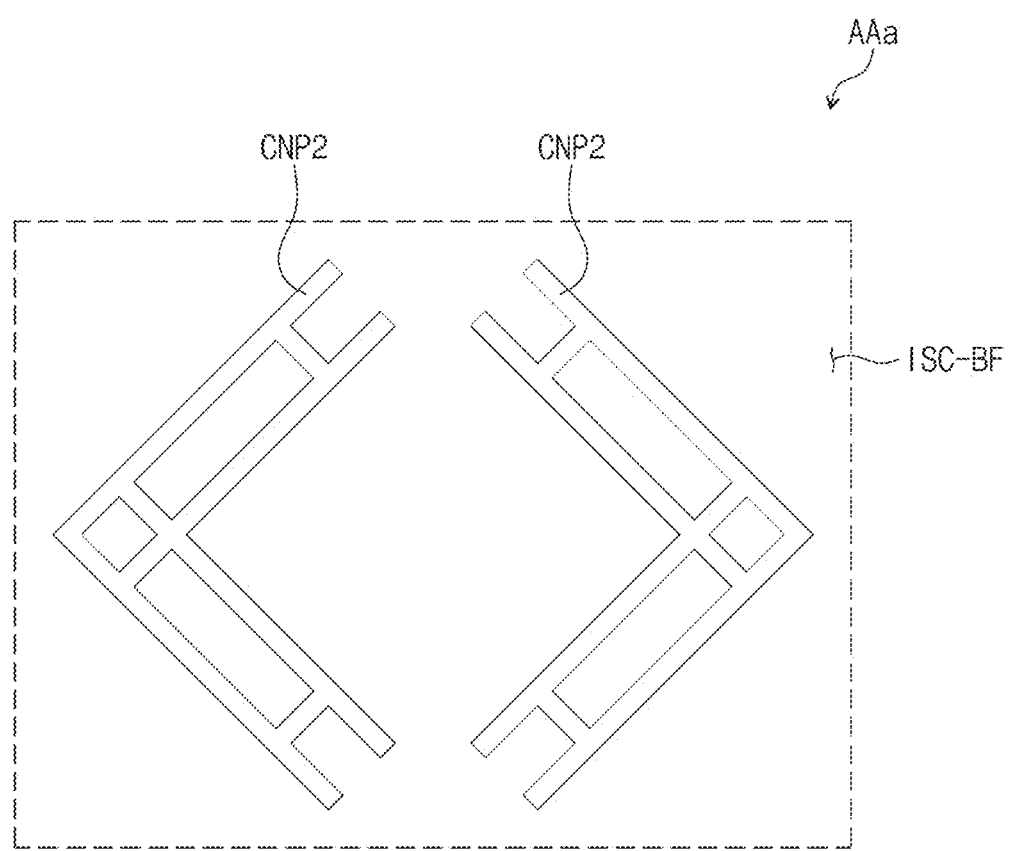
FIG. 6, FIG. 7, and FIG. 8 are plan views, each of which illustrates a layer provided in the region AA of FIG. 5.
Figure 7:
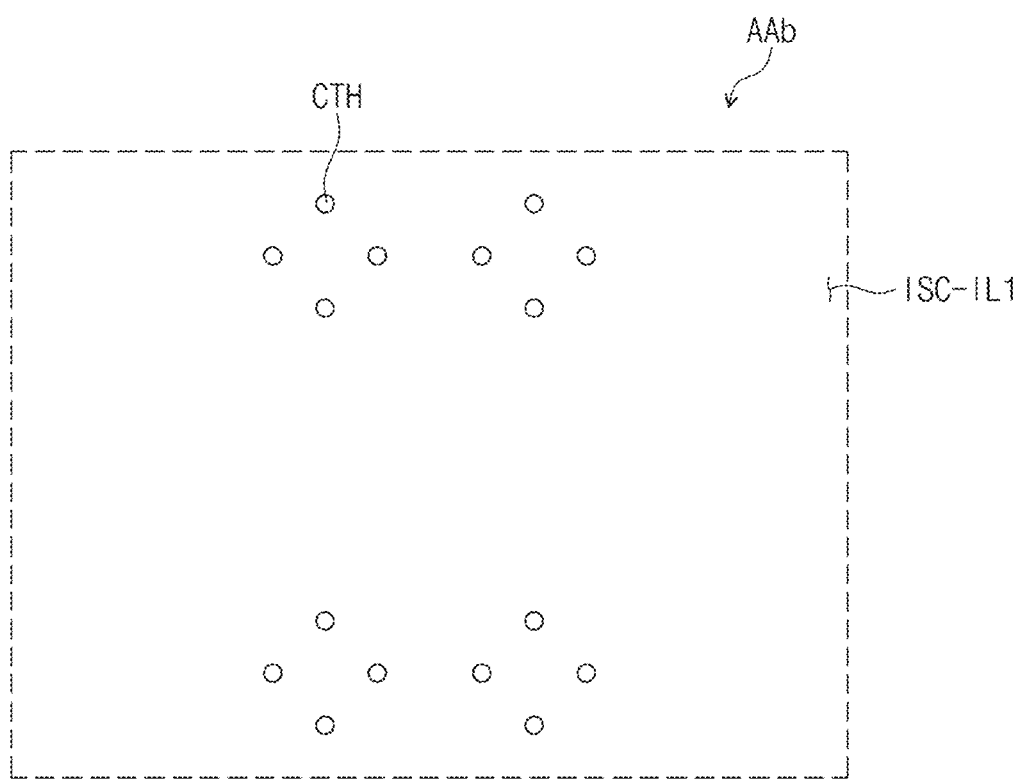
Figure 8:
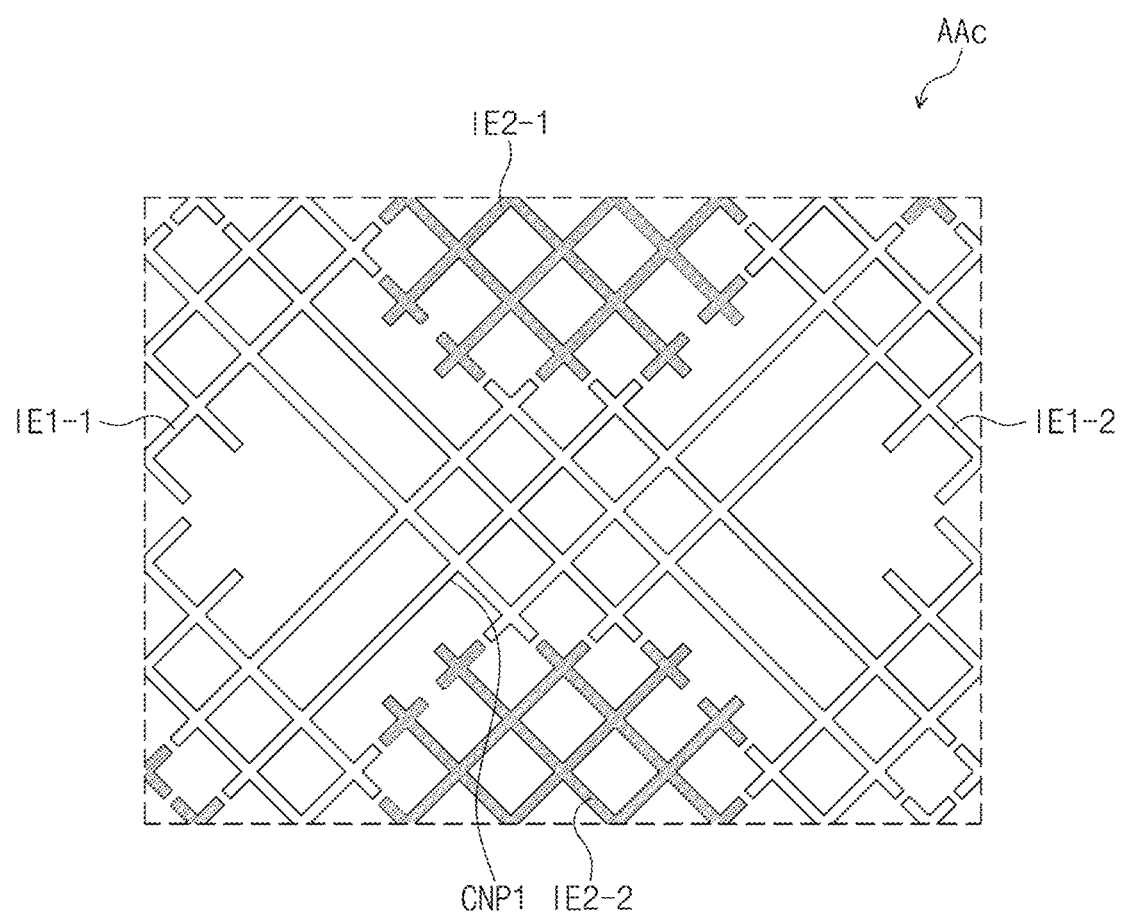

FIG. 5 is an enlarged plan view of a region AA of FIG. 4. FIGS. 6 to 8 are plan views, each of which illustrates a layer provided in the region AA.

A region AAa of FIG. 6 is a portion of a first conductive pattern ISC-CP1 corresponding to the region AA of FIG. 5. A region AAb of FIG. 7 is a portion of a first insulating layer ISC-IL1 corresponding to the region AA of FIG. 5. A region AAc of FIG. 8 is a portion of a second conductive pattern ISC-CP2 corresponding to the region AA of FIG. 5.

Referring to FIG. 5, a direction between the first direction DR1 and the second direction DR2 may be defined as a fourth direction DR4. A fifth direction DR5 may be defined as a direction orthogonal to the fourth direction DR4. For example, the fourth direction DR4 may be at an angle of 45° from the first direction DR1 clockwise and an angle of 45° from the second direction DR2 counterclockwise. The fifth direction DR5 may be at an angle of 45° from the first direction DR1 counterclockwise and at an angle of 135° to the second direction DR2 counterclockwise. Lines that are disposed in the region AA to form the first and second conductive patterns ISC-CP1 and ISC-CP2 may extend in the fourth direction DR4 or the fifth direction DR5. FIGS. 4 to 8 illustrate an example, in which the first conductive pattern ISC-CP1 is disposed below the second conductive pattern ISC-CP2, but the inventive concept is not limited to this example. In certain embodiments, the second conductive pattern ISC-CP2 may be disposed below the first conductive pattern ISC-CP1.

Referring to FIG. 8, the second conductive pattern ISC-CP2 may include first sensors IE1-1 (herein also referred to as a left first sensor) and IE1-2 (herein also referred to as a right first sensor), second sensors IE2-1 (herein also referred to as an upper second sensor) and IE2-2 (herein also referred to as a lower second sensor), and a first connection pattern CNP1. Referring to FIG. 6, the first conductive pattern ISC-CP1 may include a second connection pattern CNP2. The second connection pattern CNP2 may be disposed on a silicon-buffer layer ISC-BF. The second connection pattern CNP2 may connect the second sensors IE2-1 and IE2-2 (e.g., see FIG. 8) that are adjacent to each other.

Referring to FIG. 7, a plurality of contact holes CTH may be defined in the first insulating layer ISC-IL1. Each of the contact holes CTH may expose a portion of the second connection pattern CNP2. For example, the contact holes CTH may be defined to expose two opposite ends of the second connection pattern CNP2. The number of the contact holes CTH may vary depending on the second connection pattern CNP2.

The first sensors IE1-1 and IE1-2, the second sensors IE2-1 and IE2-2, and the first connection pattern CNP1 may be disposed on the first insulating layer ISC-IL1. Referring to FIG. 8, the left first sensors IE1-1 and the right first sensors IE1-2 may be electrically connected to each other by the first connection pattern CNP1. The upper second sensor IE2-1 and the lower second sensor IE2-2 may be electrically connected to each other by the second connection pattern CNP2 through the contact holes CTH of the first insulating layer ISC-IL1.

The first connection pattern CNP1 may be disposed between the upper second sensor IE2-1 and the lower second sensor IE2-2. The first connection pattern CNP1 may be electrically isolated from the upper second sensor IE2-1 and the lower second sensor IE2-2.

A plurality of touch openings OP-ISC (e.g., see FIG. 5) may be defined between the lines that are disposed in the region AA to form the first and second conductive patterns ISC-CP1 and ISC-CP2. In an embodiment, each of the touch openings OP-ISC may correspond to each pixel PX (e.g., see FIG. 3).

According to one embodiment, light generated by an emission layer EML of the pixel PX may be emitted to the outside through each of the touch openings OP-ISC. The touch opening OP-ISC may overlap a first electrode EL1 of the light emitting device LD, which will be describe later in more detail.

FIGS. 9 to 13 are sectional views, each of which illustrates a portion of a display module DM, DM-1, DM-2, DM-3, or DM-4 according to an embodiment of the inventive concept.

In an embodiment, each of the display modules DM, DM-1, DM-2, and DM-3 shown in FIGS. 9 to 12 may include one of the display panel DP, DP-1, and DP2 and one of the input sensing circuit ISC and ISC-1. In an embodiment, the display module DM-4 shown in FIG. 13 may include the display panel DP and a light control layer LCL.

In an embodiment, the display panel DP may include the base layer BS, the circuit device layer DP-CI, the display device layer DP-OLED, the thin encapsulation layer TFE, and the anti-reflection layer RPP. These layers may be configured to have substantially the same features as those described with reference to FIG. 2B. Although not shown, the base layer BS may include a barrier layer, a buffer layer, a gate insulating layer, transistors, and an interlayered insulating layer. The barrier layer and the buffer layer may prevent the pixel PX from being contaminated by a contamination material in the base layer BS. In addition, the barrier layer and the buffer layer may prevent external moisture from entering the pixels PX.

The gate insulating layer may include an organic layer and/or an inorganic layer. The gate insulating layer may include a plurality of inorganic thin films. Examples of the inorganic thin films may include, but are not limited to, a silicon nitride layer and a silicon oxide layer. Control electrodes (e.g., gate electrodes) of various transistors (not shown) included in the base layer BS may be disposed on the gate insulating layer. At least a portion of the scan lines SL and the emission control lines ECL (e.g., see FIG. 3) may be disposed on the gate insulating layer.

The interlayered insulating layer may be disposed on the gate insulating layer to cover the control electrodes of the transistors. The interlayered insulating layer may include an organic layer and/or an inorganic layer. The interlayered insulating layer may include a plurality of inorganic thin films or a plurality of organic thin films. The inorganic thin films may include a silicon nitride layer and/or a silicon oxide layer.

Figure 9:
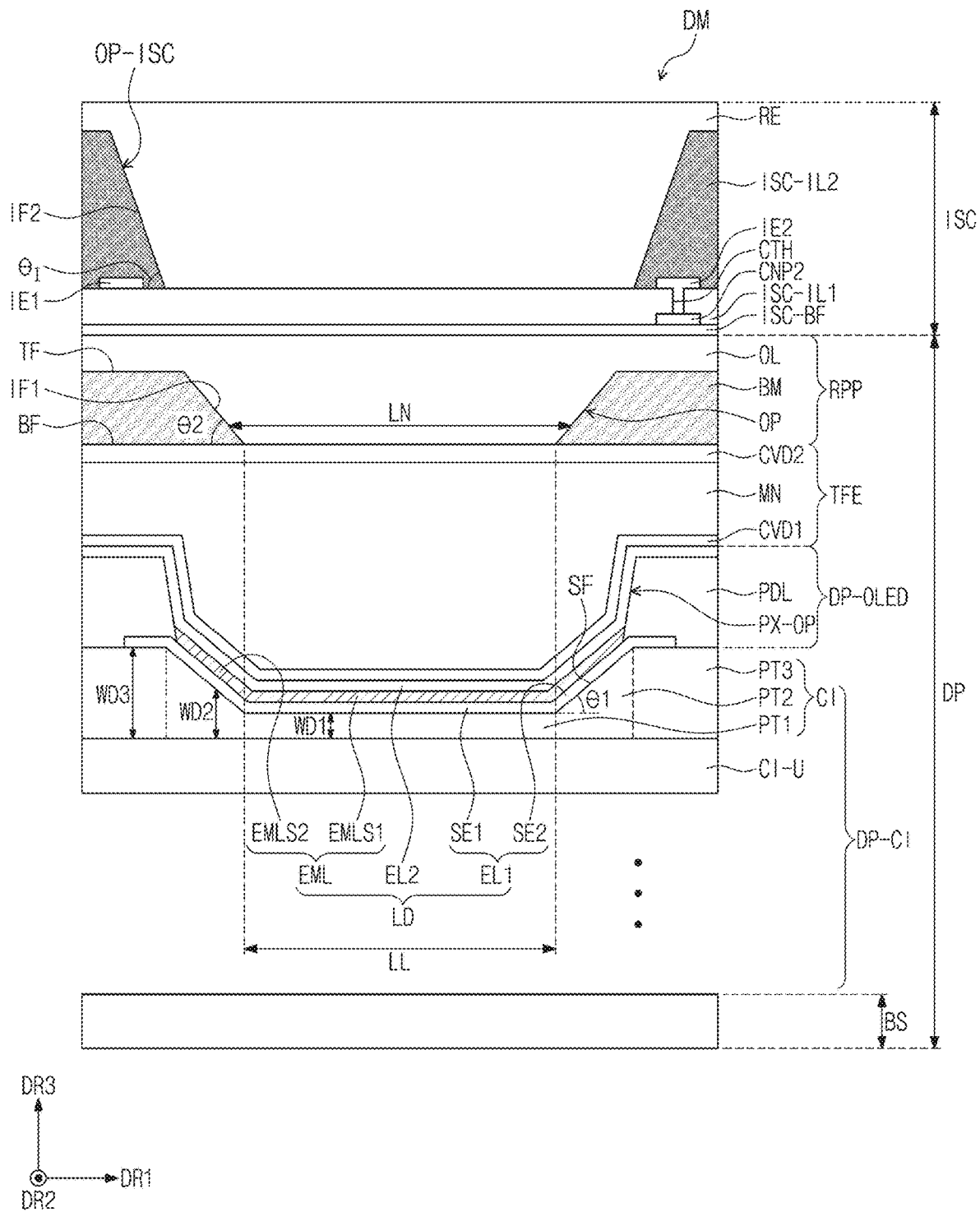
FIG. 9, FIG. 10, FIG. 11, FIG. 12, and FIG. 13 are sectional views, each of which illustrates a portion of a display module according to an embodiment of the inventive concept.

The circuit device layer DP-CI may be disposed on the base layer BS. For the convenience of explanation, FIG. 9 illustrates only the circuit insulating layer CI and the intermediate insulating layer CI-U of the circuit device layer DP-CI. The circuit insulating layer CI may include an organic layer and/or an inorganic layer. For example, the circuit insulating layer CI may be an organic layer.

The intermediate insulating layer CI-U may be disposed between the circuit insulating layer CI and the base layer BS. The intermediate insulating layer CI-U may include at least one intermediate inorganic layer and at least one intermediate organic layer. The intermediate inorganic and the intermediate organic layers are not limited to specific materials. It is noted that FIGS. 10 to 13 show the circuit insulating layer CI and the intermediate insulating layer CI-U of the circuit device layer DP-CI omitting the base layer BS.

Referring to the display module DM of FIG. 9, the circuit insulating layer CI may include a first portion PT1, a second portion PT2, and a third portion PT3. The first portion PT1 may have a first thickness WD1. The first thickness WD1 of the first portion PT1 may be measured in the third direction DR3. The first thickness WD1 may be uniform. Herein the expression that a thickness of a layer is uniform may indicate that the layer has a thickness is substantially constant or intended to be constant, but it may actually vary within a manufacturing tolerance or depending on an underlying layer.

The second portion PT2 may extend from the first portion PT1 in the third direction DR3. The second portion PT2 may have a second thickness WD2. The second thickness WD2 of the second portion PT2 may be measured in the third direction DR3. The second thickness WD2 may gradually increase in the third direction DR3 from the first portion PT1 toward the third portion PT3. For example, the second portion PT2 may include an inclined surface SF connecting the first portion PT1 to the third portion PT3. The inclined surface SF may be inclined at a first inclination angle $\theta 1$ with respect to the surface of the base layer BS. The first inclination angle $\theta 1$ may be an acute angle.

The third portion PT3 may extend from the second portion PT2. The third portion PT3 may have the third thickness WD3 in the third direction DR3. The third thickness WD3 of the third portion PT3 may be measured in the third direction DR3. The third thickness WD3 may be uniform. However, the inventive concept is not limited to this example, and in an embodiment, the third portion PT3 may have a varying thickness or at least two different uniform thicknesses. The second thickness WD2 of the second portion PT2 may gradually increase from the first thickness WD1 to a third thickness WD3 of the third portion PT3.

In an embodiment, the first to third portions PT1 to PT3 of the circuit insulating layer CI may be provided as a single layer. For example, the first to third portions PT1 to PT3 of the circuit insulating layer CI may be formed by the same process and may be continuously connected to each other. However, the inventive concept is not limited to this example, and the first to third portions PT1 to PT3 of the circuit insulating layer CI may be formed separately by different processes and stacked on top of one another.

The light emitting device LD may be disposed on the circuit insulating layer CI. The light emitting device LD may include a first electrode EL1, an emission layer EML, and a second electrode EL2.

The first electrode EL1 may be disposed on the circuit insulating layer CI. The first electrode EL1 may be a pixel electrode. The first electrode EL1 may be formed of or include at least one of metal alloys or conductive compounds. The first electrode EL1 may be a transflective or reflective electrode. The first electrode EL1 may include at least one of Ag, Mg, Cu, Al, Pt, Pd, Au, Ni, Nd, Ir, Cr, Li, Ca, LiF/Ca, LiF/Al, Mo, and Ti, or compounds or mixtures thereof (e.g., a mixture of Ag and Mg). Alternatively, the first electrode EL1 may be a multi-layered structure including a reflective or transflective layer (e.g., made of one of the above-listed materials) and a transparent conductive layer (e.g., made of indium tin oxide (ITO), indium zinc oxide (IZO), zinc oxide (ZnO), or indium tin zinc oxide (ITZO)). For example, the first electrode EL1 may be a multiple metal layer and may have a stacked structure, including metal layers of ITO/Ag/ITO.

The first electrode EL1 may include a first electrode portion SE1 and a second electrode portion SE2. The first electrode portion SE1 may be disposed on and parallel to the first portion PT1. The second electrode portion SE2 may be disposed on and parallel to the second portion PT2. In other words, the second electrode portion SE2 may be disposed along the inclined surface SF of the second portion PT2.

The emission layer EML may be disposed on the first electrode EL1. The emission layer EML may include a first light-emitting portion EMLS1 and a second light-emitting portion EMLS2. The first light-emitting portion EMLS1 may be disposed on and parallel to the first electrode portion SE1. The second light-emitting portion EMLS2 may be disposed on and parallel to the second electrode portion SE2. In other words, the second light-emitting portion EMLS2 may be disposed along the inclined surface SF of the second portion PT2.

The display device layer DP-OLED a pixel definition layer PDL and a pixel opening PX-OP defined in the pixel definition layer PDL. The pixel definition layer PDL may be disposed on the circuit insulating layer CI. The pixel opening PX-OP may expose the emission layer EML.

The second electrode EL2 may be disposed on the emission layer EML. The second electrode EL2 may cover the pixel definition layer PDL and the emission layer EML.

The thin encapsulation layer TFE may be disposed on the light emitting device LD. For example, the thin encapsulation layer TFE may be disposed on the second electrode EL2. The thin encapsulation layer TFE may seal the light emitting device LD to protect the light emitting device LD from external oxygen or moisture.

In one embodiment, the thin encapsulation layer TFE may include a first inorganic layer CVD1, an organic layer MN, and a second inorganic layer CVD2. FIG. 9 illustrates an example, in which the thin encapsulation layer TFE includes two inorganic layers and one organic layer, but the inventive concept is not limited to this example. For example, the thin encapsulation layer TFE may include three inorganic layers and two organic layers, and in this case, the inorganic and organic layers may be alternately stacked.

The anti-reflection layer RPP may be disposed on the thin encapsulation layer TFE. The anti-reflection layer RPP may include the partition wall BM and the organic layer OL. The partition wall BM may absorb external light that is incident from the outside through the window unit WP. The partition wall BM may suppress reflection of the external light from incident into the display panel.

The partition wall BM may include a top surface TF, a bottom surface BF, and a first inner side surface IF1. The bottom surface BF may be disposed to face the top surface TF. When measured in the third direction DR3, the base layer BS may be farther from the top surface TF than from the bottom surface BF.

The first inner side surface IF1 may define an opening OP. The first inner side surface IF1 may be included at a second inclination angle θ2 with respect to the bottom surface BF of the partition wall BM. The second inclination angle θ2 may be an acute angle.

The opening OP may overlap the first portion PT1, when viewed in a plan view. In detail, the smallest value of widths LN of the opening OP may be equal to a length LL of the first portion PT1. In the present specification, the length LL of the first portion PT1 may be the longest length of the first portion PT1. In other words, when viewed in a sectional view of the display device DD, the first portion PT1 may have various lengths, and the length LL may be the largest value of such lengths of the first portion PT1. In the present specification, the width LN of the opening OP may be a length of the opening OP measured in the second direction DR2. In addition, the opening OP may overlap the first light-emitting portion EMLS1, when viewed in a plan view. Accordingly, light that is emitted from the first light-emitting portion EMLS1 may be emitted to the outside of the window unit WP through the opening OP.

The input sensing circuit ISC may be disposed on the anti-reflection layer RPP. The input sensing circuit ISC may include the silicon-buffer layer ISC-BF, the second connection pattern CNP2, the first insulating layer ISC-IL1, the plurality of first and second sensors IE1 and IE2, and a second insulating layer ISC-IL2. However, the inventive concept is not limited to this example, and in an embodiment, some of the layers or elements may be omitted.

The silicon-buffer layer ISC-BF may be formed of or include silicon nitride (SiNx). However, the inventive concept is not limited to this example, and in an embodiment, the silicon-buffer layer ISC-BF may be omitted. In the case where the silicon-buffer layer ISC-BF is omitted, a thickness of the display panel DP may be reduced.

The second connection pattern CNP2 may be disposed on the silicon-buffer layer ISC-BF. In the case where the silicon-buffer layer ISC-BF is omitted, the second connection pattern CNP2 may be directly disposed on the anti-reflection layer RPP. In this case, the second connection pattern CNP2 may be in contact with the anti-reflection layer RPP.

The first insulating layer ISC-IL1 may be disposed on the silicon-buffer layer ISC-BF. For example, the first insulating layer ISC-IL1 may be disposed on the silicon-buffer layer ISC-BF and may cover the second connection pattern CNP2. The first insulating layer ISC-IL1 may include the contact holes CTH, each of which exposes a portion of the second connection pattern CNP2.

The first sensor IE1 and the second sensor IE2 may be disposed on the first insulating layer ISC-IL1. The first sensor IE1 and the second sensor IE2 may be spaced apart from each other. At least one of the first and second sensors IE1 and IE2 may be electrically connected to the second connection pattern CNP2 through the contact hole CTH. For example, the second sensor IE2 may be electrically connected to the second connection pattern CNP2 through the contact hole CTH. The first sensor IE1 may be electrically isolated from the second sensor IE2 by the first insulating layer ISC-IL1.

The second insulating layer ISC-IL2 may be disposed on the first insulating layer ISC-IL1 and cover the plurality of first and second sensors IE1 and IE2. The second insulating layer ISC-IL2 may include a second inner side surface IF2 adjacent to the touch opening OP-ISC. The second inner side surface IF2 may be inclined at an acute angle $\theta_I$ that is greater than the second inclination angle $\theta 2$. The second insulating layer ISC-IL2 may have a first refractive index. The input sensing circuit ISC may include a third insulating layer RE. The third insulating layer RE may be disposed on the first insulating layer ISC-IL1 and the second insulating layer ISC-IL2 to cover the first insulating layer ISC-IL1 and the second insulating layer ISC-IL2. The third insulating layer RE may have a second refractive index that is greater than the first refractive index of the second insulating layer ISC-IL2.

In the display module DM according to an embodiment of the inventive concept, a sum of the first inclination angle $\theta 1$ of the inclined surface SF and the second inclination angle $\theta 2$ of first inner side surface IF1 may be substantially equal to 90°, and light emitting from the second light-emitting portion EMLS2 may be emitted to the outside of the window unit WP. For example, the light emitted from the second light-emitting portion EMLS2 may be incident onto the second inner side surface IF2 of the second insulating layer ISC-IL2 through the opening OP. Due to a difference in refractive index between the third and second insulating layers RE and ISC-IL2 and the consequent total reflection, the light emitted from the second light-emitting portion EMLS2 and incident onto the second inner side surface IF2 may be reflected to the outside of the window unit WP. Accordingly, the light emitted from the second light-emitting portion EMLS2 may be totally reflected by the second inner side surface IF2 and emitted to the outside of the window unit WP. In other words, not only the light emitted from the first light-emitting portions EMLS1 but also the light emitted from second light-emitting portion EMLS2 may be emitted to the outside of the window unit WP through the opening OP.

As a comparative example, if the sum of the first and second inclination angles $\theta 1$ and $\theta 2$ is smaller or greater than 90°, the light emitted from the second light-emitting portion EMLS2 may not pass through the opening OP due to the partition wall BM blocking in its way. In this case, a portion of the light emitted from the emission layer EML may be partially blocked by the anti-reflection layer RPP.

The structure of the display module DM may not be limited to the afore-described structure, and in an embodiment, the display module DM may further include one or more functional layers (not shown). In one embodiment, the display module DM may further include the afore-described destructive interference structure that may reduce the reflection of an external light. The functional layers may be further disposed between the organic layer OL and the third insulating layer RE. In an embodiment, the functional layers disposed between the organic layer OL and the third insulating layer RE may cause a destructive interference, thereby reducing the reflection of an external light.

Figure 10:
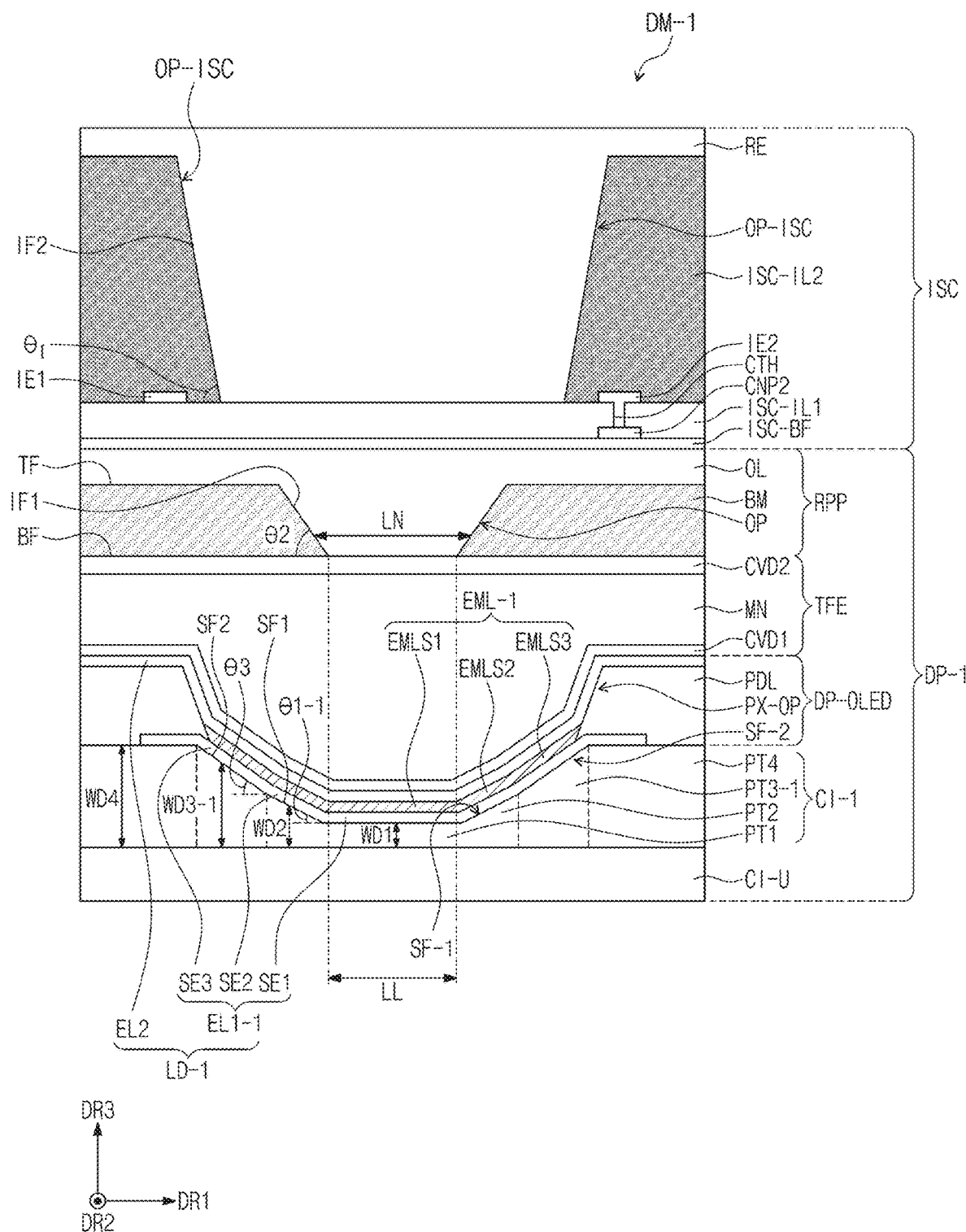

Referring to FIG. 10, the display module DM-1 may include a display panel DP-1 and the input sensing circuit ISC. The display panel DP-1 includes a circuit insulating layer CI-1, the display device layer DP-OLED, the thin encapsulation layer TFE, and the anti-reflection layer RPP. The circuit insulating layer CI-1 included in the display panel DP-1 is different from the circuit insulating layer CI included in the display panel DP of FIG. 9. The circuit insulating layer CI-1 may include a first portion PT1, a second portion PT2, a third portion PT3-1, and a fourth portion PT4.

The first portion PT1 may have a first thickness WD1. The first thickness WD1 may be uniform. The second portion PT2 may extend from the first portion PT1 in the third direction DR3. The second portion PT2 may have a second thickness WD2. The second thickness WD2 may gradually increase in the third direction DR3 from the first portion PT1 toward the third portion PT3-1. For example, the second portion PT2 may include a first inclined surface SF1 connecting the first portion PT1 to the third portion PT3-1. The first inclined surface SF1 may be inclined at a first inclination angle $\theta 1$-$1$ with respect to surface of the base layer BS. The first inclination angle $\theta 1$-$1$ may be an acute angle.

The third portion PT3-1 may extend from the second portion PT2 in the third direction DR3. The third portion PT3-1 may have a third thickness WD3-1 that is larger than the second thickness WD2. The third thickness WD3-1 may gradually increase in the third direction DR3 from the second portion PT2 toward the fourth portion PT4. The third portion PT3 may include a second inclined surface SF2. The second inclined surface SF2 may be inclined at a third inclination angle $\theta 3$ with respect to surface of the base layer BS. The third inclination angle $\theta 3$ may be an acute angle. In an embodiment, the third inclination angle $\theta 3$ may be greater than the first inclination angle $\theta 1$-$1$. For example, a thickness increasing rate of the third portion PT3 per unit length may be greater than a thickness increasing rate of the second portion PT2 per unit length.

The fourth portion PT4 may extend from the third portion PT3. The fourth portion PT4 may have a fourth thickness WD4. The fourth thickness WD4 may be measured in the third direction DR3. The fourth thickness WD4 maybe uniform.

In an embodiment, a first electrode EL1-1 may include a third electrode portion SE3 in addition to the first electrode portion SE1 and the second electrode portion SE2. The third electrode portion SE3 may be disposed parallel to the third portion PT3. The first electrode EL1-1 may be disposed on the third portion PT3. In other words, the third electrode portion SE3 may be disposed parallel to or along the second inclined surface SF2 of the third portion PT3. However, the inventive concept is not limited to this example, and in an embodiment, the third electrode portion SE3 may extend to cover at least a portion of the fourth portion PT4.

In an embodiment, an emission layer EML-1 may include a third light-emitting portion EMLS3 in addition to the first light-emitting portion EMLS1 and the second light-emitting portion EMLS2. The third light-emitting portion EMLS3 may be disposed parallel to or along the third electrode portion SE3. The third light-emitting portion EMLS3 may be disposed on the third electrode portion SE3. In other words, the third light-emitting portion EMLS3 may be disposed parallel to or along the second inclined surface SF2 of the third portion PT3.

In the display module DM-1 according to an embodiment of the inventive concept, a sum of the second inclination angle θ2 of first inner side surface IF1 and the third inclination angle θ3 of the second inclined surface SF2 may be substantially equal to 90°, and light emitted from the third light-emitting portion EMLS3 may be emitted to the outside of the window unit WP. For example, the light emitted from the third light-emitting portion EMLS3 may be incident onto the second inner side surface IF2 of the second insulating layer ISC-IL2 through the opening OP. Due to a difference in refractive index between the third and second insulating layers RE and ISC-IL2 and the consequent total reflection, the light emitted from the third light-emitting portion EMLS3 and incident onto the second inner side surface IF2 may be reflected to the outside of the window unit WP. Accordingly, the light emitted from the third light-emitting portion EMLS3 may be totally reflected by the second inner side surface IF2 and emitted to the outside of the window unit WP. Similarly, light that is emitted from the second light-emitting portion EMLS2 having an inclination angle smaller than the third light-emitting portion EMLS3 may also be emitted to the outside of the window unit WP. In other words, the lights emitted from the first to third light-emitting portions EMLS1 to EMLS3 may be totally emitted to the outside of the window unit WP through the opening OP.

As a comparative example, if the sum of the first inclination angle θ1-1 and the third inclination angle θ3 is smaller or greater than 90°, the light emitted from the second light-emitting portion EMLS2 or the third light-emitting portion EMLS3 may not pass through the opening OP due to the partition wall BM blocking in its way. In this case, the light emitted from the emission layer EML-1 may be partially blocked by the anti-reflection layer RPP.

Except for this difference, the display module DM-1 of FIG. 10 may have substantially the same features as the display module DM described with reference to FIG. 9.

Figure 11:
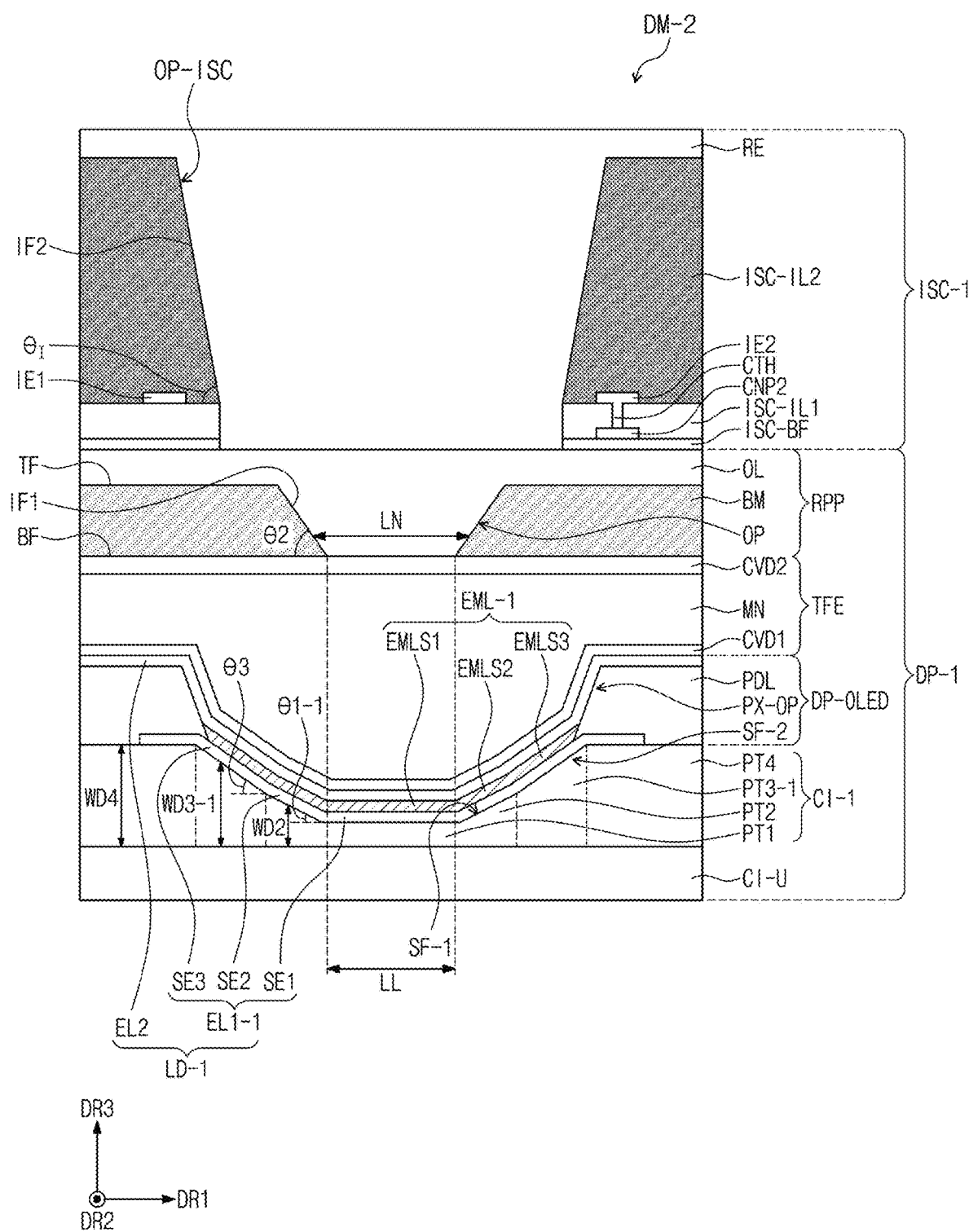

Referring to FIG. 11, the display module DM-2 may include the display panel DP-1 and an input sensing circuit ISC-1 according to an embodiment of the inventive concept. The input sensing circuit ISC-1 may include the silicon-buffer layer ISC-BF and the first insulating layer ISC-IL1 that are partially removed. For example, the silicon-buffer layer ISC-BF and the first insulating layer ISC-IL1 may be disposed to overlap the second insulating layer ISC-IL2, when viewed in a plan view.

Except for this difference, the display module DM-2 of FIG. 11 may have substantially the same features as the display modules DM and DM-1 described with reference to FIGS. 9 and 10.

At least one of the circuit insulating layers CI, CI-1, and CI-2 according to example embodiments of FIGS. 9 to 12 may be formed by applying a multi-tone mask to a sing layer.

Figure 12:
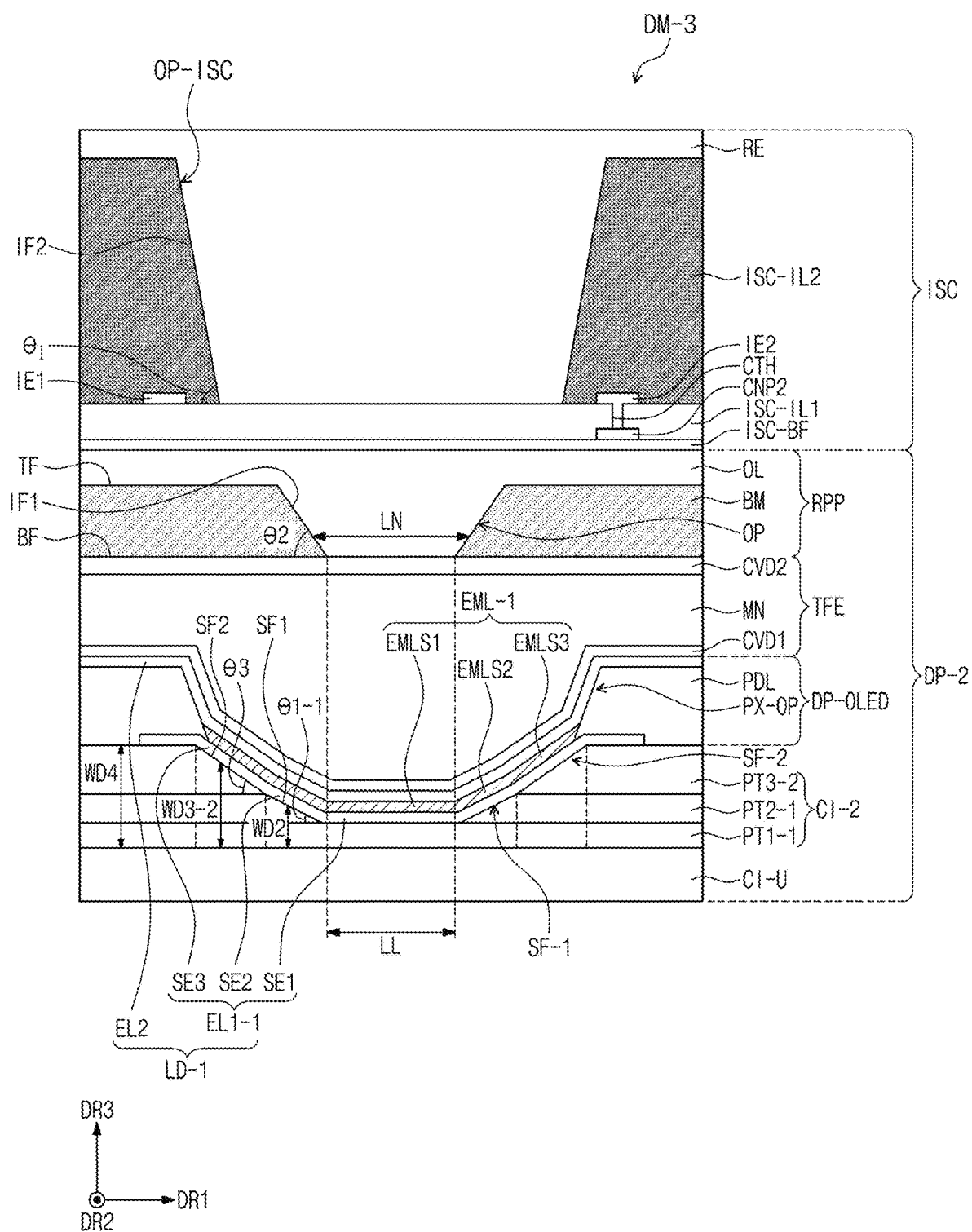

Referring to FIG. 12, the display module DM-3 may include the display panel DP-2 and the input sensing circuit ISC. The display panel DP-1 may include a circuit insulating layer CI-2 according to an embodiment of the inventive concept. The circuit insulating layer CI-2 may include a first sub-layer PT1-1, a second sub-layer PT2-1, and a third sub-layer PT3-2.

The first sub-layer PT1-1 may be disposed on and parallel to the base layer BS.

The second sub-layer PT2-1 may be disposed on and parallel to the first sub-layer PT1-1. For example, the second sub-layer PT2-1 may include the first inclined surface SF1 that is an inner side surface defining the pixel opening PX-OP. The first inclined surface SF1 may be inclined at the first inclination angle θ1-1 with respect to the base layer BS. The first inclination angle θ1-1 may be an acute angle.

The third sub-layer PT3-2 may be disposed on and parallel to the second sub-layer PT2-1. For example, the third sub-layer PT3-2 may include the second inclined surface SF2 that is an inner side surface defining the pixel opening PX-OP. The second inclined surface SF2 may be inclined at the third inclination angle θ3. The third inclination angle θ3 may be an acute angle.

Referring to FIG. 12, the circuit insulating layer CI-2 may include a plurality of stacked layers that are formed by separate processes. For example, the first to third sub-layers PT1-1, PT2-1, and PT3-2 may be formed by using separate masks, respectively. Except for this difference, the display module DM-3 of FIG. 12 may have substantially the same features as the display modules DM and DM-1 described with reference to FIGS. 9 and 10.

Figure 13:
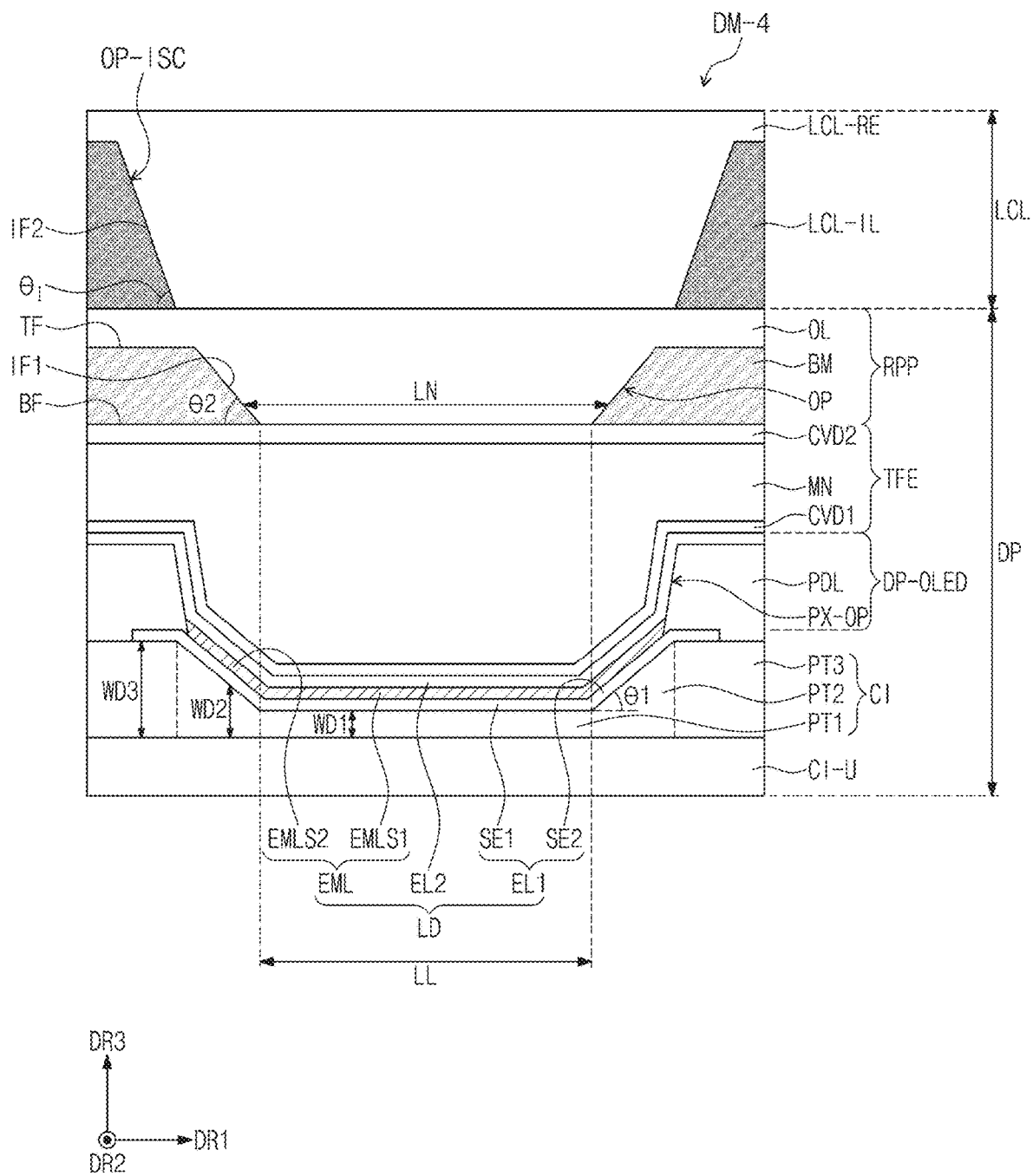

Referring to FIG. 13, the display module DM-4 may include the display panel DP and a light control layer LCL. The light control layer LCL may be disposed on the display panel DP.

In an embodiment, the light control layer LCL may include a first light control layer LCL-IL and a second light control layer LCL-RE. The first light control layer LCL-IL and the second light control layer LCL-RE may be substantially similar layers as the second insulating layer ISC-IL2 and the third insulating layer RE that were described with reference to FIGS. 9 to 12.

For example, the first light control layer LCL-IL may include the second inner side surface IF2 defining the touch opening OP-ISC. In addition, an angle between the second inner side surface IF2 and the base layer BS may be an acute angle $θ_I$ that is greater than the second inclination angle θ2. The first light control layer LCL-IL may have a first refractive index. The second light control layer LCL-RE may be disposed on the display panel DP to cover the first light control layer LCL-IL. The second light control layer LCL-RE may have a second refractive index greater than the first refractive index.

Except for these differences, the display panel DP of the display module DM-4 may have substantially the same features as one of the display panel DP, DP-1, or DP-2 described with reference to FIGS. 9 and 12. For example, the display panel DP may further include the anti-reflection layer RPP and the thin encapsulation layer TFE. The touch opening OP-ISC of the light control layer LCL may overlap the opening OP of the anti-reflection layer RPP.

Figure 14:
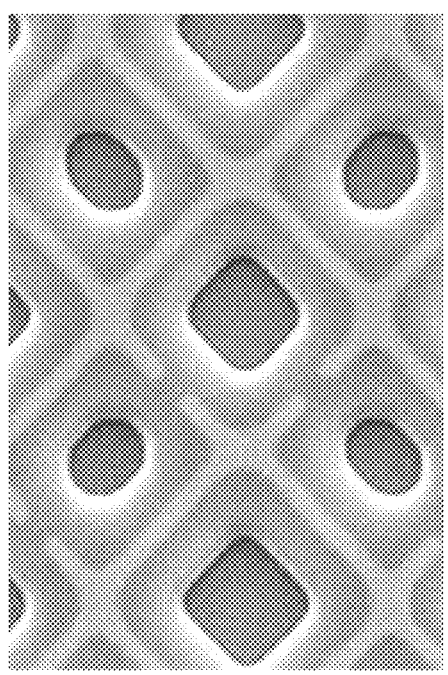
FIG. 14 is an image showing a pixel according to an embodiment of the inventive concept.

FIG. 14 is an image showing the pixel PX according to an embodiment of the inventive concept. The opening OP, the touch opening OP-ISC, and the pixel opening PX-OP of FIGS. 9 to 13 may have various shapes (e.g., circular, diamond, and polygonal shapes), as shown in the image of FIG. 14. That is, the inventive concept may not be limited to the specific shapes of the openings OP, OP-ISC, and PX-OP.

Figure 15:
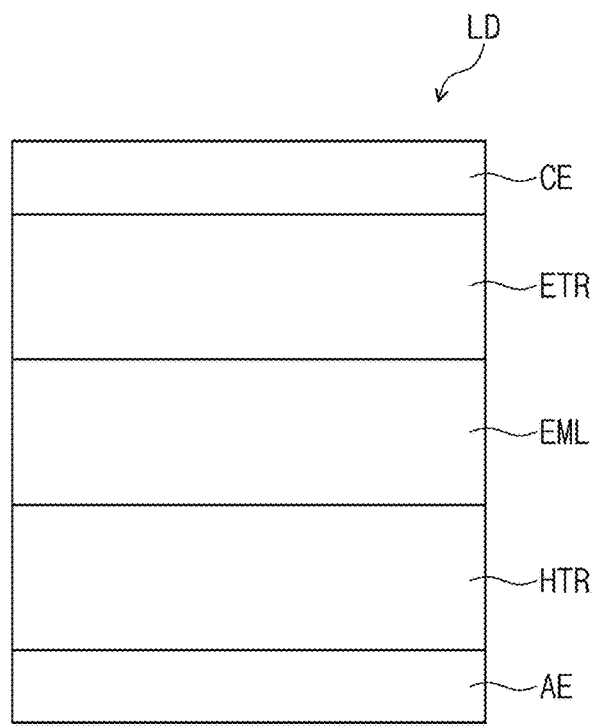
FIG. 15 and FIG. 16 are sectional views schematically illustrating an emission layer according to an embodiment of the inventive concept.
Figure 16:
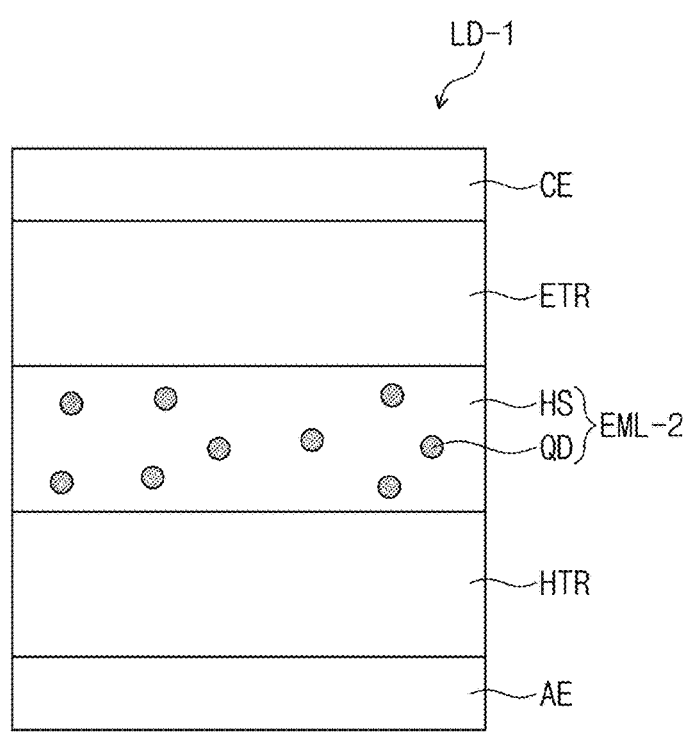

FIGS. 15 and 16 are sectional views schematically illustrating a light emitting device LD or LD-1 according to an embodiment of the inventive concept.

Referring to FIGS. 15 and 16, the light emitting device LD may include an anode electrode AE (also referred to as the first electrode EL1), the emission layer EML, and a common electrode CE (also referred to as the second electrode EL2). The emission layer EML may include a plurality of organic layers.

The organic layers may include a hole transport region HTR that is disposed between the anode electrode AE and the emission layer EML, and an electron transport region ETR that is disposed between the emission layer EML and the common electrode CE.

Each of the hole transport region HTR and the electron transport region ETR may include a plurality of sub-organic layers. For example, the hole transport region HTR may include a hole injection layer HIL and a hole transport layer HTL as its sub-organic layers, and the electron transport region ETR may include an electron injection layer EIL and an electron transport layer ETL as its sub-organic layers. However, the inventive concept is not limited to this example, and in an embodiment, the hole transport region HTR may further include a different sub-organic layer, such as an electron blocking layer (not shown), and the electron transport region ETR may further include a different sub-organic layer, such as a hole blocking layer (not shown).

The hole transport region HTR may be provided on the anode electrode AE. The hole transport region HTR may include the hole injection layer HIL, the hole transport layer HTL, and so forth. In an embodiment, in addition to the hole injection layer HIL and the hole transport layer HTL, the hole transport region HTR may further include at least one of a hole buffer layer (not shown) and an electron blocking layer (not shown). The hole buffer layer (not shown) may compensate a resonance distance that depends on the wavelength of light emitted from the emission layer EML, and thus, the hole buffer layer may contribute to increase light emission efficiency. A material that is included in the hole transport region HTR, may be included in the hole buffer layer. The electron blocking layer may prevent electrons from being injected from the electron transport region ETR into the hole transport region HTR.

The hole transport region HTR may have a single-layered structure that is formed of a single material or of a plurality of different materials, or a multi-layered structure including a plurality of layers that are formed of a plurality of different materials. As an example, the hole transport region HTR may have a single-layer structure that may be made of one or more of a plurality of different materials. As another example, the hole transport region HTR may have one of multi-layered structures including the hole injection layer HIL/the hole transport layer HTL, the hole injection layer HIL/the hole transport layer HTL/the hole buffer layer (not shown), the hole injection layer HIL/the hole buffer layer (not shown), the hole transport layer HTL/the hole buffer layer (not shown), or the hole injection layer HIL/the hole transport layer HTL/the electron blocking layer (not shown) that are sequentially stacked on the anode electrode AE, but the inventive concept is not limited to these examples.

The hole transport region HTR may be formed by at least one of various methods, such as a vacuum deposition method, a spin coating method, a cast method, a Langmuir-Blodgett (LB) method, an inkjet printing method, a laser printing method, and a laser-induced thermal imaging (LITI) method.

The hole injection layer HIL may include phthalocyanine compounds (such as copper phthalocyanine), DNTPD(N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino) triphenylamine), TDATA(4,4'4"-Tris (N,N-diphenylamino)triphenylamine), 2-TNATA(4,4',4"-tris{N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS((Polyaniline)/Poly(4-styrenesulfonate)), NPB(N,N'-di(naphthalene-1-yl)-N,N'-diphenyl-benzidine), polyether ketone(TPAPEK) containing triphenylamine, 4-Isopropyl-4'-methyldiphenyliodonium Tetrakis(pentafluorophenyl)borate, or HAT-CN(dipyrazino[2,3-f: 2',3'-h] quinoxaline-2,3,6,7,10,11-hexacarbonitrile).

The hole transport layer HTL may include, for example, carbazole derivatives (such as N-phenylcarbazole or polyvinylcarbazole), fluorine derivatives, triphenylamine derivatives (such as TPD(N,N'-bis(3-methylphenyl)-N,N'-diphenyl-[1,1-biphenyl]-4,4'-diamine) or TCTA(4,4',4"-tris(N-carbazolyl)triphenylamine)), NPB(N,N'-di(naphthalene-1-yl)-N, N'-diphenyl-benzidine), TAPC(4,4'-Cyclohexylidene bis[N,N-bis(4-methylphenyl)benzenamine]), HMTPD(4,4'-Bis[N,N'-(3-tolyl)amino]-3,3'-dimethylbiphenyl), or mCP (1,3-Bis(N-carbazolyl)benzene).

Referring to FIG. 16, the light emitting device LD-1 may include a plurality of quantum dots QD in an emission layer EML-2. For example, the emission layer EML-2 may include a base portion HS and the plurality of quantum dots QD dispersed in the base portion HS. A core of the quantum dot QD may be selected from a group including II-VI compounds, III-V compounds, IV-VI compounds, IV elements, IV compounds, and combination thereof. The II-VI compounds may be selected from a group including binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The III-V compounds may be selected from a group including binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InNP, InNAs, InNSb, InPAs, InPSb, and GaAlNP), mixtures of the ternary compounds, quaternary compounds (e.g., including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds.

The IV-VI compounds may be selected from a group including binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The IV elements may be selected from a group including Si, Ge, and mixtures thereof. The IV compounds may include binary compounds selected from a group including SiC, SiGe, and mixtures thereof.

Here, the binary, ternary, or quaternary compound may have a uniform concentration throughout a particle or may have a spatially varying concentration distribution in each particle. In an embodiment, each of the quantum dots may have a core/shell structure, in which the core is enclosed by the shell.

In some embodiments, a core of the quantum dot QD may contain the afore-described nanocrystal. The shell of the quantum dot QD may serve as a protection layer that prevents chemical characteristics of the core from being changed and preserves the semiconductor property of the core. In one embodiment, the shell of the quantum dot QD may serve as a charging layer that imparts an electrophoretic property to the quantum dot QD. The shell may be a single layer or a multiple layer. At an interface between the core and the shell, an element contained in the shell may have a concentration gradient decreasing in a central direction. For example, the shell of the quantum dot QD may be formed of or include oxide compounds of metallic or nonmetallic elements, semiconductor compounds, or any combination thereof.

The oxide compounds of metallic or nonmetallic elements may be, for example, binary compounds (e.g., $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO), or ternary compounds (e.g., $MgAl_2O_4$, $CoFe_2O_4$, $NIFe_2O_4$, and $CoMn_2O_4$), but the inventive concept is not limited to these examples.

In addition, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and so forth, but the inventive concept is not limited to these examples.

Each of the quantum dots QD may have a light-emitting wavelength spectrum whose full width half maximum (FWHM) is less than about 45 nm (for example, less than about 40 nm or, less than about 30 nm) to improve color purity or color reproduction characteristics. Furthermore, the quantum dots QD may emit light radially (i.e., in all directions), and thus, it may be possible to improve a viewing angle property.

In an embodiment, the quantum dot QD may be a spherical, pyramid-shaped, multi-arm, or cubic nano particle. In another embodiment, the quantum dot QD may be a nano tube, a nano wire, a nano fiber, or a nano plate-shaped particle, but the inventive concept is not limited to these examples.

A wavelength or color of light emitted from the quantum dot QD may be determined by a particle size of the quantum dot QD, and by providing quantum dots of various sizes, it may be possible to realize various colors (e.g., blue, red, and green). The smaller the particle size of the quantum dot QD, the shorter the wavelength of light emitted from the quantum dot QD. For example, a particle size of a quantum dot emitting a green light may be smaller than a particle size of a quantum dot emitting a red light. In addition, a particle size of a quantum dot emitting a blue light may be smaller than a particle size of a quantum dot emitting the green light.

In the light emitting device LD-1, the emission layer EML-2 may include a host and a dopant. In an embodiment, a host material may be included in the base portion HS of the emission layer EML-2, and the quantum dot QD may be used as a dopant material.

In the light emitting device LD-1, the emission layer EML-2 may have a fluorescent light emission property. For example, the quantum dot QD may be used as a fluorescent dopant material.

A wavelength of light emitted from the emission layer EML-2 may be changed depending on a type of the quantum dot QD. According to the type of the quantum dot QD, the emission layer EML-2 may emit a blue light, a green light, or a red light.

The emission layer EML-2 may be formed by using at least one of various methods, such as a vacuum deposition method, a spin coating method, a cast method, a Langmuir-Blodgett (LB) method, an inkjet printing method, a laser printing method, and a laser-induced thermal imaging (LITI) method.

In the emission layer EML-2, the quantum dots QD may be provided to form one or more layers. As an example, the quantum dots QD in the emission layer EML-2 may be provided to form two stacked layers. However, the inventive concept is not limited to this example, and in an embodiment, the quantum dots QD may be provided to form one to ten stacked layers. The number of the layers forming the quantum dots QD may be determined in consideration of the type of the quantum dot QD and/or a desired wavelength of light emitted therefrom.

In the light emitting device LD-1, the emission layer EML-2 may further include at least one of known anthracene-based luminescent materials.

In an embodiment, the emission layer EML-2 may further include at least one of known host materials. For example, the emission layer EML-2 may further include Alq3 (tris (8-hydroxyquinolino)aluminum), CBP (4,4'-bis (N-carbazolyl)-1,1'-biphenyl), PVK (poly (n-vinylcabazole), ADN (9,10-di (naphthalene-2-yl)anthracene), TCTA (4,4',4"-Tris (carbazol-9-yl)-triphenylamine), TPBi (1,3,5-tris (N-phenylbenzimidazole-2-yl)benzene), TBADN (3-tert-butyl-9, 10-di (naphth-2-yl)anthracene), DSA (distyrylarylene), CDBP (4,4'-bis (9-carbazolyl)-2,2'-dimethyl-biphenyl), MADN (2-Methyl-9,10-bis (naphthalen-2-yl)anthracene), DPEPO (bis[2-(diphenylphosphino)phenyl] ether oxide), CP1 (Hexaphenyl cyclotriphosphazene), UGH2 (1,4-Bis (triphenylsilyl)benzene), $DPSiO_3$ (Hexaphenyl cyclotrisiloxane), $DPSiO_4$ (Octaphenylcyclotetra siloxane), PPF (2,8-Bis (diphenylphosphoryl)dibenzofuran), mCBP (3,3'-bis (N-carbazolyl)-1,1'-biphenyl), mCP (1,3-Bis (N-carbazolyl) benzene), and so forth, as its host material. However, the inventive concept is not limited to this example, and in an embodiment, besides the host materials enumerated above, at least one of other known host materials may be included in the emission layer EML-2.

In an embodiment, the emission layer EML-2 of the light emitting device LD-1 may further include at least one of known dopant materials. For example, the emission layer EML may further include styryl derivatives (e.g., 1, 4-bis [2-(3-N-ethylcarbazoryl)vinyl]benzene (BCzVB), 4-(di-p-tolylamino)-4'-[(di-p-tolylamino)styryl]stilbene (DPAVB), or N-(4-((E)-2-(6-((E)-4-(diphenylamino)styryl)naphthalen-2-yl)vinyl)phenyl)-N-phenylbenzen amine (N-BDAVBi)), perylene and its derivatives (e.g., 2, 5, 8, 11-Tetra-t-butylperylene (TBP)), pyrene and its derivative (e.g., 1, 1-dipyrene, 1, 4-dipyrenylbenzene, 1, 4-Bis(N, N-Diphenylamino)pyrene), as its dopant material.

According to an embodiment of the inventive concept, a display module may reduce reflectance of an external light.

According to an embodiment of the inventive concept, a display module may increase an amount of light directly emitted, thereby improving optical efficiency.

While the example embodiments of the present inventive concepts have been particularly shown and described, it will be understood by one of ordinary skill in the art that variations in form and detail may be made therein without departing from the spirit and scope of the present disclosure.

What is claimed is:

1. A display module comprising:
   a base layer;
   a circuit insulating layer disposed on the base layer;
   a pixel definition layer disposed on the circuit insulating layer and including a pixel opening;
   an emission layer disposed on the pixel opening;
   encapsulation layer disposed on the emission layer;
   a partition wall disposed on the encapsulation layer; and
   an input sensing circuit disposed on the partition wall,
   wherein the input sensing circuit comprises:
   a first insulating layer,
   a plurality of sensors disposed on the first insulating layer, and
   a second insulating layer covering the plurality of sensors and including a touch opening, and
   wherein the second insulating layer, the partition wall, and the pixel definition layer overlap in a plan view.

2. The display module of claim 1, wherein the partition wall includes an opening, and
   wherein the pixel opening, the opening, and the touch opening overlap in a plan view.

3. The display module of claim 2, wherein a width of the opening is smaller than that of the pixel opening.

4. The display module of claim 2, wherein a width of the opening is smaller than that of the touch opening.

5. The display module of claim 2, wherein each of inner surfaces respectively defining the opening and the touch opening inclined with respect to the base layer in a cross-sectional view, and
   wherein an inclined angle of each of the inner surfaces is smaller than 90°.

6. The display module of claim 2, wherein the circuit insulating layer includes:
   a first portion having a first thickness;
   a second portion having a second thickness that is greater than the first thickness; and
   a third portion having a third thickness that is greater than the second thickness, and
   wherein the opening overlaps the first portion.

7. The display module of claim 6, wherein the second portion comprises a first inclined surface having a first inclination angle with respect to the base layer in a cross-sectional view.

8. The display module of claim 7, wherein an inner side surface of the partition wall defining the opening has a second inclination angle from the base layer in a cross-sectional view,
   wherein the second portion comprises a first inclined surface having a third inclination angle with respect to the base layer in a cross-sectional view, and
   wherein a first inclination angle between the second inner side surface and the base layer in a cross-sectional view is greater than a second inclination angle between the first inner side surface and the base layer in the cross-sectional view.

9. The display module of claim 8, wherein a sum of the first inclination angle and the third inclination angle is substantially 90°.

10. The display module of claim 1, wherein the input sensing circuit further comprises:
    a connection pattern disposed between the plurality of sensors and the encapsulation layer, and
    wherein the first insulating layer includes a contact hole exposing at least a portion of the connection pattern, and
    wherein the portion of the connection pattern is electrically connected to at least a portion of the plurality of sensors.

11. The display module of claim 1, wherein the input sensing circuit further comprises:
    a third insulating layer disposed on the first insulating layer and the second insulating layer and having a second refractive index that is greater than a first refractive index of the second insulating layer.

* * * * *